(12) United States Patent
Yoshida et al.

(10) Patent No.: US 10,546,694 B2
(45) Date of Patent: Jan. 28, 2020

(54) MULTILAYER CAPACITOR

(71) Applicant: TDK CORPORATION, Tokyo (JP)

(72) Inventors: Takeru Yoshida, Tokyo (JP); Hideki Kamo, Tokyo (JP); Naoto Imaizumi, Tokyo (JP); Keiichi Takizawa, Tokyo (JP); Takuya Imaeda, Tokyo (JP); Shogo Murosawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/122,217

(22) Filed: Sep. 5, 2018

(65) Prior Publication Data
US 2019/0080846 A1 Mar. 14, 2019

(30) Foreign Application Priority Data
Sep. 8, 2017 (JP) ................. 2017-173411

(51) Int. Cl.
*H01G 2/06* (2006.01)
*H01G 4/005* (2006.01)
(Continued)

(52) U.S. Cl.
CPC .............. *H01G 4/30* (2013.01); *H01G 2/065* (2013.01); *H01G 4/005* (2013.01); *H01G 4/12* (2013.01); *H01G 4/224* (2013.01); *H05K 1/03* (2013.01)

(58) Field of Classification Search
CPC .......... H01G 2/06; H01G 2/065; H01G 4/005; H01G 4/12; H01G 4/224; H01G 4/232;
(Continued)

(56) References Cited

U.S. PATENT DOCUMENTS 9,666,373 B2 * 5/2017 Fujii ................. H01G 4/30
2015/0364256 A1 * 12/2015 Zenzai ................. C09D 5/24
361/301.4

(Continued)

FOREIGN PATENT DOCUMENTS

JP S54-005755 U 1/1979
JP 4-44130 U1 4/1992
JP H07-135124 A 5/1995

OTHER PUBLICATIONS

Jan. 30, 2019 Extended European Search Report issued in European Patent Application No. 18192999.3.

*Primary Examiner* — Timothy J Thompson
*Assistant Examiner* — Guillermo J Egoavil
(74) *Attorney, Agent, or Firm* — Oliff PLC

(57) ABSTRACT

A multilayer capacitor includes an element, a first external electrode, a second external electrode, and a plurality of internal electrodes. The plurality of internal electrodes include first internal electrodes, second internal electrodes, and a plurality of third internal electrodes. The plurality of third internal electrodes are electrically connected by a connection conductor. First capacity parts are constituted of the first internal electrodes and the third internal electrodes, and second capacity parts are constituted of the second internal electrodes and the third internal electrodes. The first capacity part and the second capacity part are electrically connected in series, and the connection conductor is disposed on at least one of the three lateral surfaces other than the lateral surface that is a mounting surface, among the four lateral surfaces.

6 Claims, 19 Drawing Sheets

(51) Int. Cl.
 *H01G 4/12* (2006.01)
 *H01G 4/224* (2006.01)
 *H01G 4/30* (2006.01)
 *H05K 1/03* (2006.01)

(58) Field of Classification Search
 CPC ........ H01G 4/2325; H01G 4/252; H01G 4/30;
  H01G 4/385; H05K 1/03; H05K 1/181;
  H05K 2201/10015; H05K 3/3442
 USPC ................................................ 361/329, 321.2
 See application file for complete search history.

(56) References Cited

U.S. PATENT DOCUMENTS

2016/0027582 A1* 1/2016 Ahn .......................... H01G 4/30
   174/260
2018/0151296 A1* 5/2018 Yamada ................. H01G 2/065

* cited by examiner

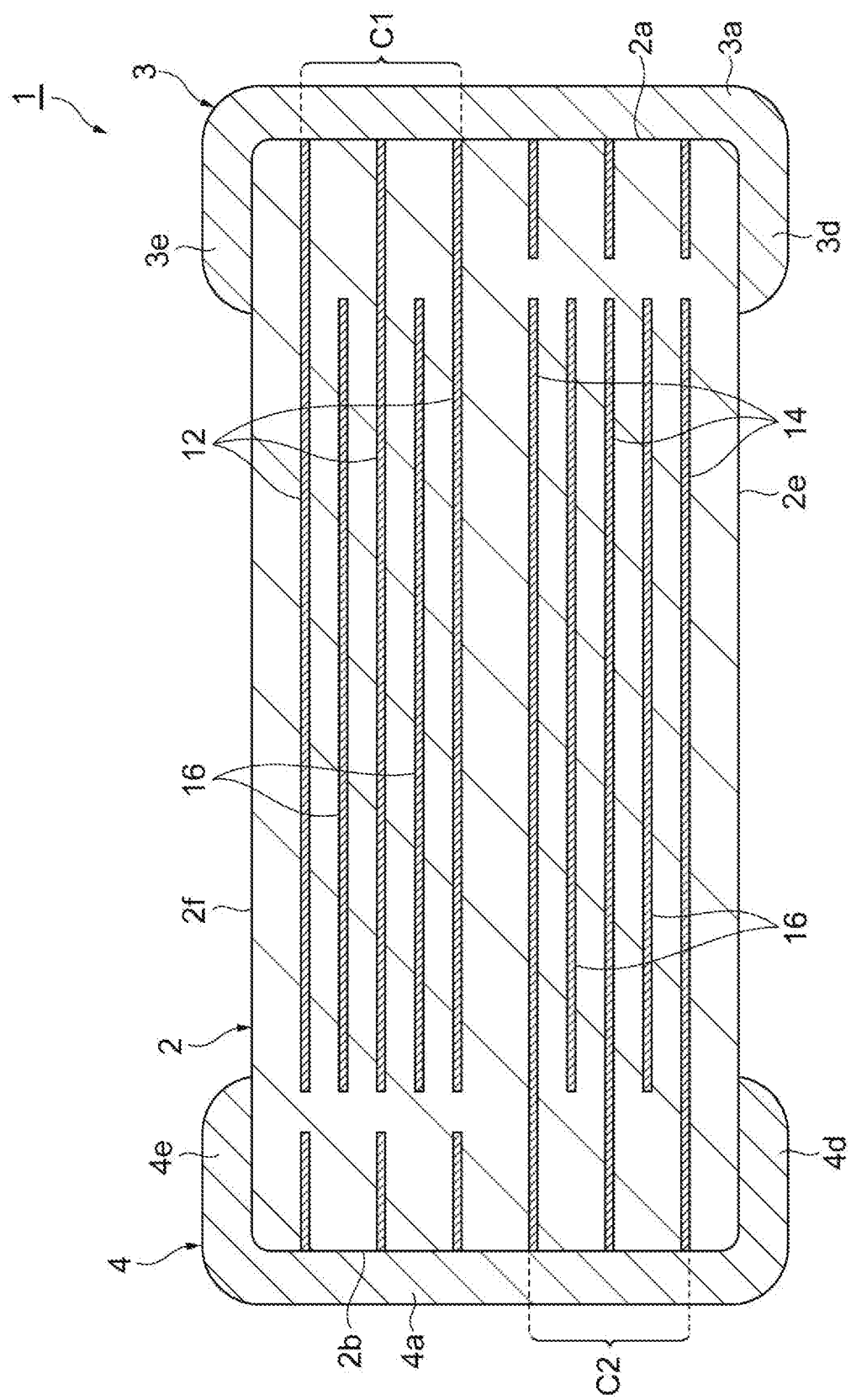

MULTILAYER CAPACITOR

TECHNICAL FIELD

The present invention relates to a multilayer capacitor.

BACKGROUND

A conventional multilayer capacitor disclosed in, for example, Patent Literature 1 (Japanese Unexamined Patent Publication No. H7-135124) is known. The multilayer capacitor disclosed in Patent Literature 1 is a multilayered ceramic capacitor in which a plurality of dielectric layers, on surfaces of which electrode patterns are arranged, are laminated, in which a plurality of parallel connected capacitor components are formed therein, and in which some of the electrode patterns arranged on the ceramic dielectric layers are divided into a plurality of sections such that each of the parallel connected capacitor components is configured to connect at least two capacitor components in series.

SUMMARY

In the conventional multilayer capacitor, at least two capacitor components are connected in series, and thereby a withstand voltage characteristic is improved. However, in the conventional multilayer capacitor, even if, for example, a failure such as a short circuit occurs at one of the parallel connected capacitor components, it has no effect on the other capacitor components. For this reason, in the conventional multilayer capacitor, even if a failure occurs at the capacitor component, capacitance and a withstand voltage are secured. Thus, even if a failure occurs after mounting, the failure cannot be detected.

An aspect of the present invention is directed to providing a multilayer capacitor capable of detecting that a failure occurs while improving a withstand voltage characteristic.

A multilayer capacitor according to an aspect of the present invention includes: an element configured to have a pair of end faces that face each other and four lateral surfaces that couple the pair of end faces; first and second external electrodes disposed close to the pair of end faces; and a plurality of internal electrodes disposed in the element. The plurality of internal electrodes include first internal electrodes that are electrically connected to the first external electrode, second internal electrodes that are electrically connected to the second external electrode, and a plurality of third internal electrodes. The plurality of third internal electrodes are electrically connected by a connection conductor. First capacity parts are constituted of the first internal electrodes and the third internal electrodes, and second capacity parts are constituted of the second internal electrodes and the third internal electrodes. The first capacity parts and the second capacity parts are electrically connected in series, and the connection conductor is disposed on at least one of the three lateral surfaces other than the lateral surface that is a mounting surface, among the four lateral surfaces.

In the multilayer capacitor according to an aspect of the present invention, the first capacity parts are constituted of the first internal electrodes that are electrically connected to the first external electrode and the third internal electrodes, and the second capacity parts are constituted of the second internal electrodes that are connected to the second external electrode and the third internal electrodes. The plurality of third internal electrodes are electrically connected to one another by the connection conductor. Thus, the multilayer capacitor has a configuration in which two capacitor components are connected in series. Therefore, in the multilayer capacitor, a withstand voltage characteristic can be improved. In the multilayer capacitor, since the first capacity parts and the second capacity parts are electrically connected in series by the plurality of third internal electrodes that are electrically connected by the connection conductor, for example, in a case where a failure occurs at the first capacity parts, changes in a capacitance and a resistance value occur. For this reason, even if a failure occurs at the multilayer capacitor after it is mounted, the failure can be detected.

In the multilayer capacitor, the connection conductor is disposed on at least one of the three lateral surfaces other than the lateral surface that is a mounting surface, among the four lateral surfaces. That is, the connection conductor is not disposed on the lateral surface that is the mounting surface. Therefore, when the multilayer capacitor is mounted, the connection conductor comes into contact with electrodes or the like of a circuit board, and the occurrence of a short circuit between the first external electrode and/or the second external electrode and the connection conductor can be inhibited. Therefore, the multilayer capacitor can have a configuration in which the first capacity parts and the second capacity parts are connected in series.

In an embodiment, the first internal electrodes, the second internal electrodes, and the third internal electrodes may be orthogonal to the mounting surface, and extend in a facing direction of the pair of end faces; and the connection conductor may be disposed on the lateral surface that faces the mounting surface. In this configuration, each of the internal electrodes is disposed to be orthogonal to the mounting surface and extend in the facing direction of the pair of end faces, and thereby the connection conductor can be disposed on the lateral surface that faces the mounting surface. Thus, in the multilayer capacitor, the occurrence of a short circuit between the first external electrode and/or the second external electrode and the connection conductor can be further inhibited. Therefore, the multilayer capacitor can have the configuration in which the first capacity parts and the second capacity parts are connected in series.

In an embodiment, each of the first external electrode and the second external electrode may have a resin electrode layer. The resin electrode layer has durability against a thermal shock. For this reason, in the multilayer capacitor, when the multilayer capacitor is mounted on a circuit board or the like, even in the case where solders are formed, deterioration caused by a thermal shock of bonded portions with the solders can be inhibited. The resin electrode layer has flexibility. For this reason, in the multilayer capacitor, when the multilayer capacitor is mounted on the circuit board, stress received from the circuit board or the like can be relaxed by the resin electrode layer. Therefore, occurrence of cracks or the like at the element of the multilayer capacitor can be inhibited.

In an embodiment, a thickness of the resin electrode layer close to the lateral surface that faces the mounting surface may be smaller than a thickness of the resin electrode layer close to the mounting surface. In this configuration, thicknesses of the first and second external electrodes close to the lateral surface that faces the mounting surface can be reduced. For this reason, in the multilayer capacitor, a distance between the first external electrode and the connection conductor and a distance between the second external electrode and the connection conductor can be secured (lengthened). Thereby, in the multilayer capacitor, the occurrence of a short circuit between the first external electrode and/or the second external electrode and the connection conductor can be inhibited. Therefore, the multilayer capacitor can have a configuration in which the first capacity parts and the second capacity parts are connected in series.

In an embodiment, the resin electrode layer may be partly disposed on each of the first external electrode and the second external electrode. In this configuration, the resin electrode layer is formed in places where the durability against the thermal shock and the flexibility are required for the first external electrode and the second external electrode. For this reason, in the multilayer capacitor, increases in the thicknesses of the first and second external electrodes can be avoided as a whole. Therefore, in the multilayer capacitor, the occurrence of a short circuit between the first external electrode and/or the second external electrode and the connection conductor can be inhibited. As a result, the multilayer capacitor can have a configuration in which the first capacity parts and the second capacity parts are connected in series.

In an embodiment, the resin electrode layer may not be disposed on the lateral surface that faces the mounting surface. The resin electrode layer need only be provided in places where the solder is formed on the first external electrode and the second external electrode and is installed on the circuit board. For this reason, in the multilayer capacitor, the resin electrode layer is not required for the lateral surface that faces the mounting surface. In this configuration, the occurrence of a short circuit between the first external electrode and/or the second external electrode and the connection conductor can be inhibited. Therefore, the multilayer capacitor can have a configuration in which the first capacity parts and the second capacity parts are connected in series.

According to an aspect of the present invention, the occurrence of a failure can be detected while a withstand voltage characteristic is improved.

BRIEF DESCRIPTION OF THE DRAWINGS

FIG. 4 is a view illustrating a sectional configuration of the multilayer capacitor illustrated in FIG. 1.

DETAILED DESCRIPTION

Hereinafter, preferred embodiments of the present invention will be described with reference to the attached drawings. In the description of the drawings, the same or equivalent elements are given the same reference signs, and duplicate description thereof will be omitted.

First Embodiment

Figure 1:
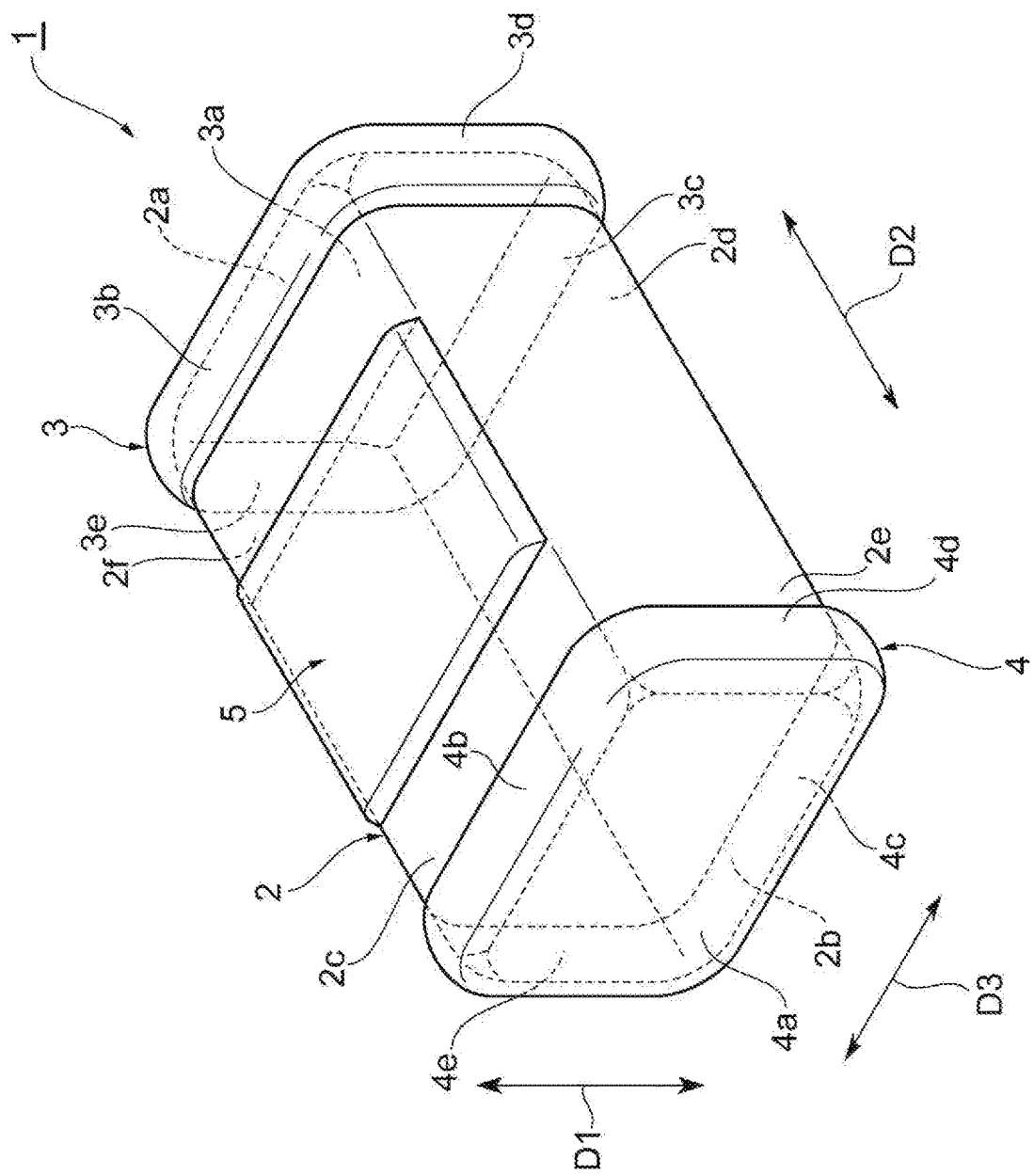
FIG. 1 is a perspective view of a multilayer capacitor according to an embodiment.
Figure 2:
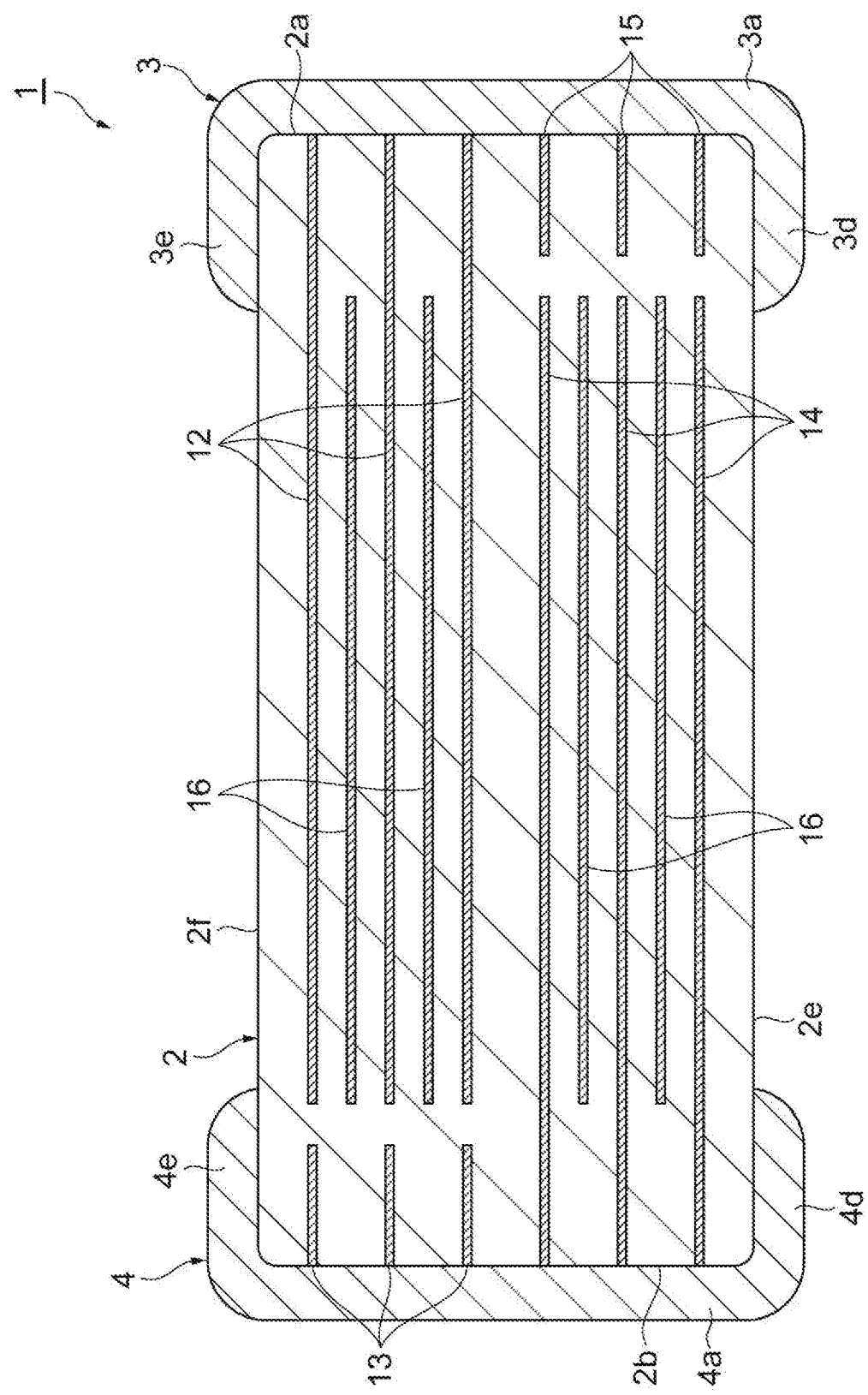
FIG. 2 is a view illustrating a sectional configuration of the multilayer capacitor according to a first embodiment.

As illustrated in FIGS. 1 and 2, a multilayer capacitor 1 according to a first embodiment includes an element 2, and a first external electrode 3, a second external electrode 4, and a connection conductor 5 that are disposed on an outer surface of the element 2.

The element 2 has a cuboid shape. Cuboid shapes include a cuboid shape in which corners and ridge lines are chamfered, and a cuboid shape in which corners and ridge lines are rounded. The element 2 has a pair of end faces 2a and 2b that face each other, a pair of main surfaces (lateral surfaces) 2c and 2d that face each other, and a pair of lateral surfaces 2e and 2f that face each other, all of which are outer surfaces. A facing direction in which the pair of main surfaces 2c and 2d face each other is a first direction D1. A facing direction in which the pair of end faces 2a and 2b face each other is a second direction D2. A facing direction in which the pair of lateral surfaces 2e and 2f face each other is a third direction D3. In the present embodiment, the first direction D1 is a height direction of the element 2. The second direction D2 is a longitudinal direction of the element 2, and is perpendicular to the first direction D1. The third direction D3 is a width direction of the element 2, and is perpendicular to the first direction D1 and the second direction D2.

Figure 7:
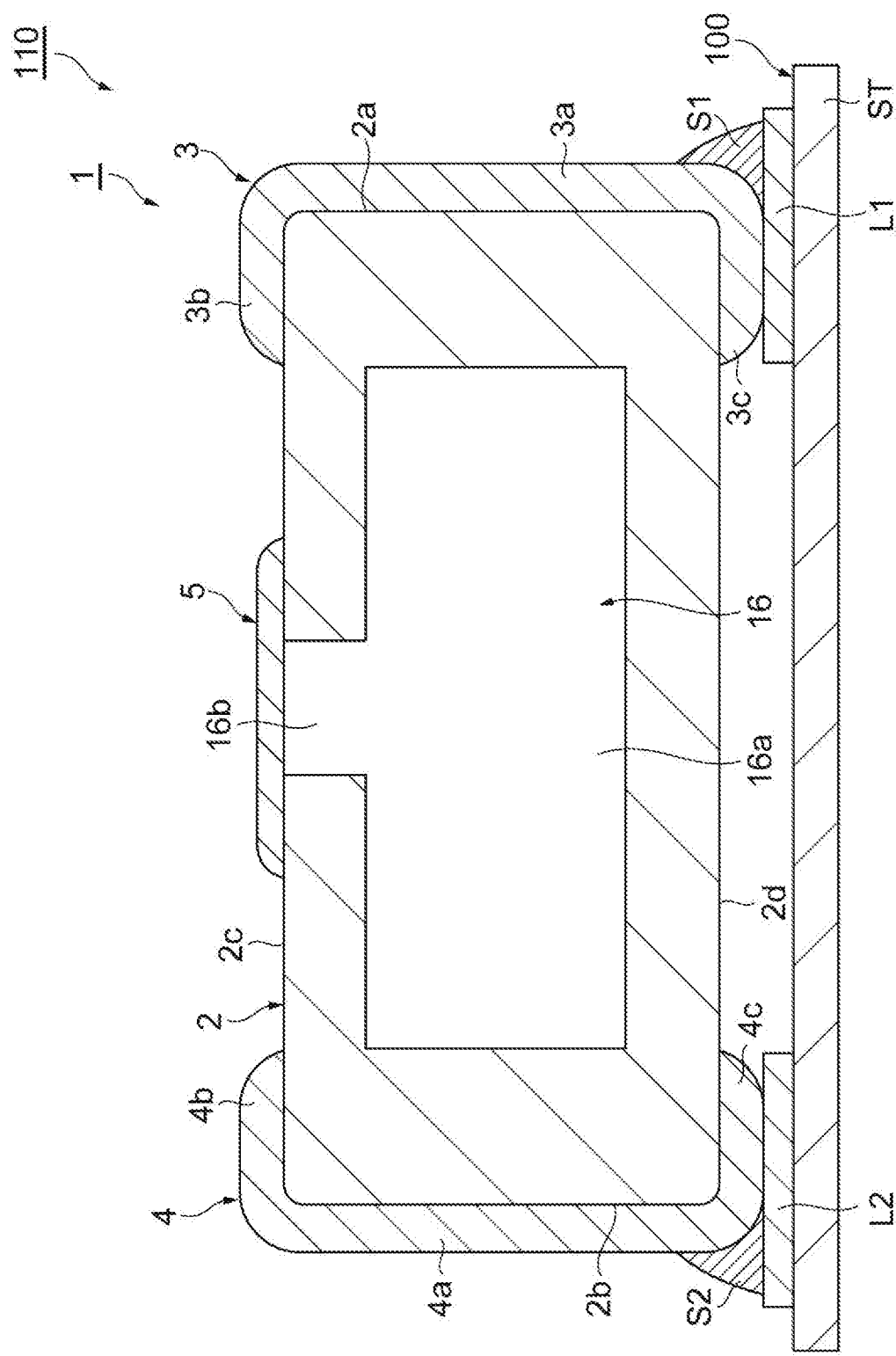
FIG. 7 is a view illustrating an electronic component device having the multilayer capacitor illustrated in FIG. 1.

The pair of end faces 2a and 2b extend in the first direction D1 to be coupled between the pair of main surfaces 2c and 2d. The pair of end faces 2a and 2b also extend in the third direction D3 (a short side direction of the pair of main surfaces 2c and 2d). The pair of lateral surfaces 2e and 2f extend in the first direction D1 to be coupled between the pair of main surfaces 2c and 2d. The pair of lateral surfaces 2e and 2f also extend in the second direction D2 (a long side direction of the pair of end faces 2a and 2b). In the present embodiment, as illustrated in FIG. 7, when the multilayer capacitor 1 is mounted on another electronic device (for example, a circuit board or an electronic component), the main surface 2d is provided as a mounting surface that faces the other electronic device.

The element 2 is configured such that a plurality of dielectric layers (insulator layers) 10 are laminated in a direction in which the pair of lateral surfaces 2e and 2f face each other. In the element 2, the laminating direction of the plurality of dielectric layers 10 (hereinafter referred to simply as "laminating direction") is identical to the third direction D3. Each of the dielectric layers 10 is formed of a sintered compact of a ceramic green sheet that includes, for example, a dielectric material (a $BaTiO_3$-based, Ba (Ti, Zr)$O_3$-based, or (Ba, Ca)$TiO_3$-based dielectric ceramic). In the actual element 2, the dielectric layers 10 are integrated to such an extent that a boundary between the dielectric layers 10 cannot be visually recognized.

As illustrated in FIG. 2, the multilayer capacitor 1 includes a plurality of first internal electrodes 12, a plurality of first dummy electrodes 13, a plurality of second internal electrodes 14, a plurality of second dummy electrodes 15, and a plurality of third internal electrodes 16, all of which are internal conductors disposed in the element 2. In the present embodiment, the number of the plurality of first internal electrodes 12 (here, three) is the same as that of the plurality of second internal electrodes 14.

The plurality of first internal electrodes 12, the plurality of first dummy electrodes 13, the plurality of second internal electrodes 14, the plurality of second dummy electrodes 15, and the plurality of third internal electrodes 16 are formed of a conductive material that is typically used for an internal electrode of a multilayered electric element (for example, Ni or Cu). The plurality of first internal electrodes 12, the plurality of first dummy electrodes 13, the plurality of second internal electrodes 14, the plurality of second dummy electrodes 15, and the plurality of third internal electrodes 16 are formed as sintered compacts of a conductive paste that contains the conductive material.

The first internal electrodes 12, the second internal electrodes 14, and the third internal electrodes 16 are disposed at different positions (layers) in the third direction D3 of the element 2. The first internal electrodes 12 and the third internal electrodes 16 are alternately disposed in the element 2 to face each other at an interval in the third direction D3. The second internal electrodes 14 and the third internal electrodes 16 are alternately disposed in the element 2 to face each other at an interval in the third direction D3. The first internal electrodes 12 and the first dummy electrodes 13 are disposed in the element 2 at the same positions (layers). The second internal electrodes 14 and the second dummy electrodes 15 are disposed in the element 2 at the same positions (layers).

As illustrated in FIG. 2, the plurality of first internal electrodes 12 are disposed in a region close to the other lateral surface 2f in the third direction D3 of the element 2. In the present embodiment, the plurality of first internal electrodes 12 are disposed in the region closer to the lateral surface 2f than the middle of the element 2 in the third direction D3.

Figure 3:
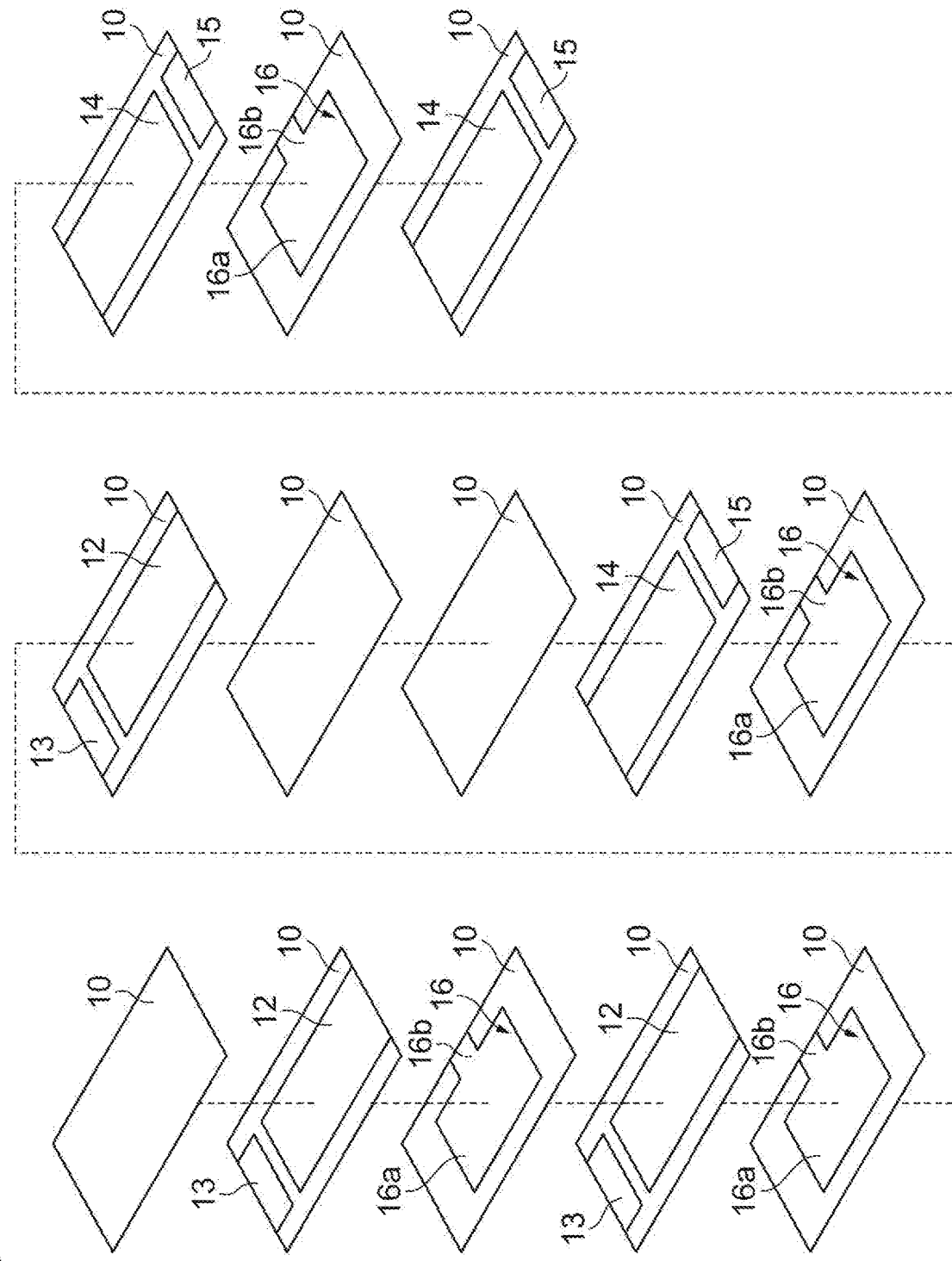
FIG. 3 is an exploded perspective view of an element of the multilayer capacitor illustrated in FIG. 1.

As illustrated in FIG. 3, each of the first internal electrodes 12 has a rectangular shape in which the second direction D2 is a long side direction and the first direction D1 is a short side direction. The first internal electrodes 12 extend in a direction perpendicular to the main surface 2d that is the mounting surface of the element 2. One ends of the first internal electrodes 12 in a longitudinal direction are exposed at one end face 2a. The other ends of the first internal electrodes 12 in the longitudinal direction are located closer to the one end face 2a than the other end face 2b, and are separated from the other end face 2b. The first internal electrodes 12 are not exposed at the other end face 2b, the pair of main surfaces 2c and 2d, and the pair of lateral surfaces 2e and 2f. The ends of the first internal electrodes 12 which are exposed at the one end face 2a are electrically connected to the first external electrode 3.

Each of the first dummy electrodes 13 has a rectangular shape in which the second direction D2 is a transverse direction and the first direction D1 is a longitudinal direction. The first dummy electrodes 13 extend in a direction perpendicular to the main surface 2d that is the mounting surface of the element 2. One ends of the first dummy electrodes 13 in the transverse direction are exposed at the other end face 2b. The other ends of the first dummy electrodes 13 in the transverse direction are located closer to the other end face 2b than the one end face 2a, and are separated from the one end face 2a. The first internal electrodes 12 and the first dummy electrodes 13 are disposed at a predetermined interval in the second direction D2 (are electrically insulated). The ends of the first dummy electrodes 13 which are exposed at the other end face 2b are electrically connected to the second external electrode 4.

As illustrated in FIG. 2, the plurality of second internal electrodes 14 are disposed in a region close to one lateral surface 2e in the third direction D3 of the element 2. In the present embodiment, the plurality of second internal electrodes 14 are disposed in the region closer to the one lateral surface 2e than the middle of the element 2 in the third direction D3.

As illustrated in FIG. 3, each of the second internal electrodes 14 has a rectangular shape in which the second direction D2 is a long side direction and the first direction D1 is a short side direction. The second internal electrodes 14 extend in a direction perpendicular to the main surface 2d that is the mounting surface of the element 2. One ends of the second internal electrodes 14 are exposed at the other end face 2b. The other ends of the second internal electrodes 14 in a longitudinal direction are located closer to the other end face 2b than the one end face 2a, and are separated from the one end face 2a. The second internal electrodes 14 are not exposed at the one end face 2a, the pair of main surfaces 2c and 2d, and the pair of lateral surfaces 2e and 2f. The ends of the second internal electrodes 14 which are exposed at the other end face 2b are electrically connected to the second external electrode 4.

Each of the second dummy electrodes 15 has a rectangular shape in which the second direction D2 is a transverse direction and the first direction D1 is a longitudinal direction. The second dummy electrodes 15 extend in a direction perpendicular to the main surface 2d that is the mounting surface of the element 2. One ends of the second dummy electrodes 15 in the transverse direction are exposed at the one end face 2a. The other ends of the second dummy electrodes 15 in the transverse direction are located closer to the one end face 2a than the other end face 2b, and are separated from the other end face 2b. The second internal electrodes 14 and the second dummy electrodes 15 are disposed at a predetermined interval in the second direction D2. The ends of the second dummy electrodes 15 which are exposed at the one end face 2a are electrically connected to the first external electrode 3.

Each of the third internal electrodes 16 includes a main electrode part 16a and a connector part 16b. The third internal electrodes 16 extend in a direction perpendicular to the main surface 2d that is the mounting surface of the element 2. The main electrode parts 16a face the first internal electrodes 12 or the second internal electrodes 14 via a part (the dielectric layers 10) of the element 2 in the third direction D3. Each of the main electrode parts 16a has a rectangular shape in which the second direction D2 is a long side direction and the first direction D1 is a short side direction. The connector parts 16b extend from one sides (one long sides) of the main electrode parts 16a, and are exposed at the one main surface 2c. The third internal electrodes 16 are exposed at the one main surface 2c, and are not exposed at the pair of end faces 2a and 2b, the other main surface 2d, and the pair of lateral surfaces 2e and 2f. The main electrode part 16a and the connector part 16b are integrally formed.

Figure 5A:
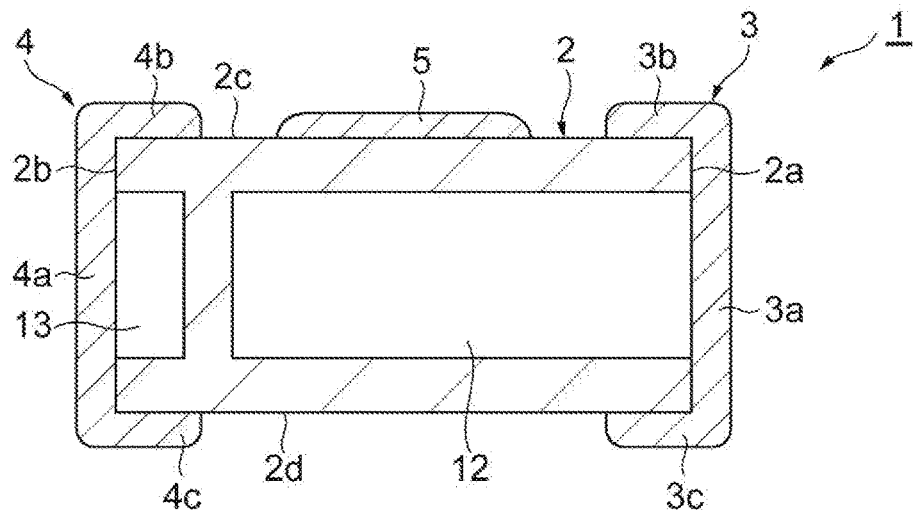
FIG. 5A is a sectional view illustrating a configuration of the multilayer capacitor illustrated in FIG. 1.

As illustrated in FIG. 1, the first external electrode 3 is disposed close to the one end face 2a. The first external electrode 3 has an electrode portion 3a disposed on the end face 2a, electrode portions 3b and 3c disposed on the pair of main surfaces 2c and 2d, respectively, and electrode portions 3d and 3e disposed on the pair of lateral surfaces 2e and 2f, respectively. The electrode portion 3a and the electrode portions 3b, 3c, 3d and 3e are connected at a ridge line part of the element 2, and are electrically connected to each other. The first external electrode 3 is formed on five surfaces of one end face 2a, the pair of main surfaces 2c and 2d, and the pair of lateral surfaces 2e and 2f. As illustrated in FIG. 5A, the electrode portion 3a is disposed to cover all the portions of the first internal electrodes 12 which are exposed at the end face 2a, and the first internal electrodes 12 are directly connected to the first external electrode 3.

Figure 5B:
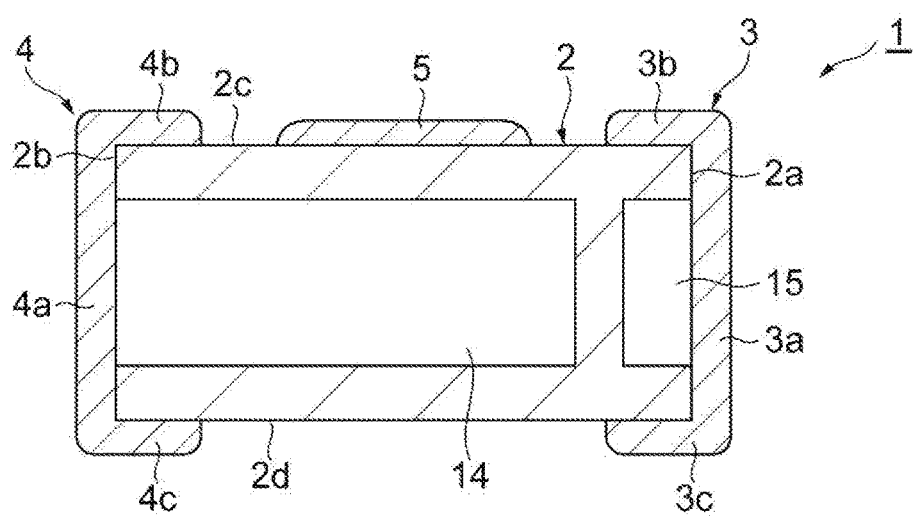
FIG. 5B is a sectional view illustrating a configuration of the multilayer capacitor illustrated in FIG. 1.

As illustrated in FIG. 1, the second external electrode 4 is disposed close to the other end face 2b. The second external electrode 4 has an electrode portion 4a disposed on the end face 2b, electrode portions 4b and 4c disposed on the pair of main surfaces 2c and 2d, respectively, and electrode portions 4d and 4e disposed on the pair of lateral surfaces 2e and 2f, respectively. The electrode portion 4a and the electrode portion 4b, 4c, 4d and 4e are connected at a ridge line part of the element 2, and are electrically connected to each other. The second external electrode 4 is formed on five surfaces of one end face 2b, the pair of main surfaces 2c and 2d, and the pair of lateral surfaces 2e and 2f. As illustrated in FIG. 5B, the electrode portion 4a is disposed to cover all the portions of the second internal electrodes 14 which are exposed at the end face 2b, and the second internal electrodes 14 are directly connected to the second external electrode 4.

Figure 5C:
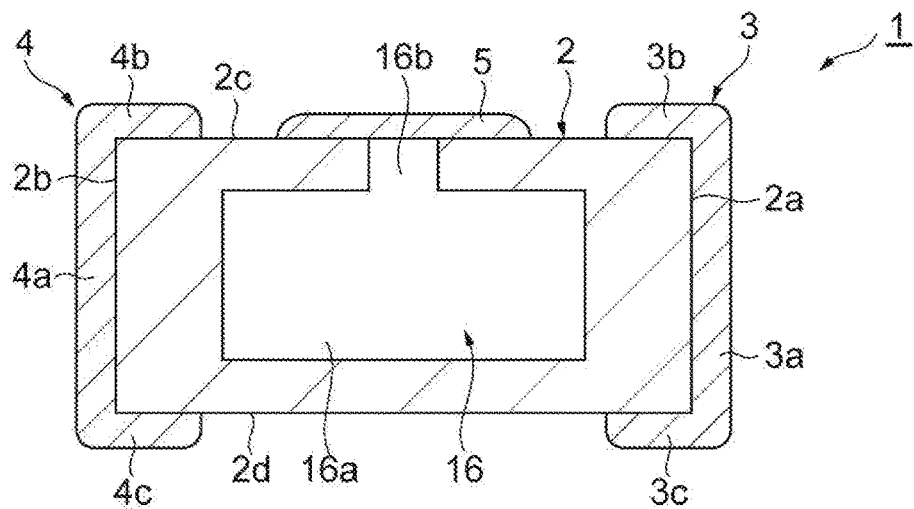
FIG. 5C is a sectional view illustrating a configuration of the multilayer capacitor illustrated in FIG. 1.

As illustrated in FIG. 1, the connection conductor 5 is disposed in the middle of the one main surface 2c in the second direction D2. As illustrated in FIG. 5C, the connection conductor 5 is disposed to cover all the portions of the connector parts 16b of the third internal electrodes 16 which are exposed at the main surface 2c, and the connector parts 16b are directly connected to the connection conductor 5. That is, the connector parts 16b connect the main electrode parts 16a and the connection conductor 5. Thereby, each of the third internal electrodes 16 is electrically connected to the connection conductor 5.

Figure 6:
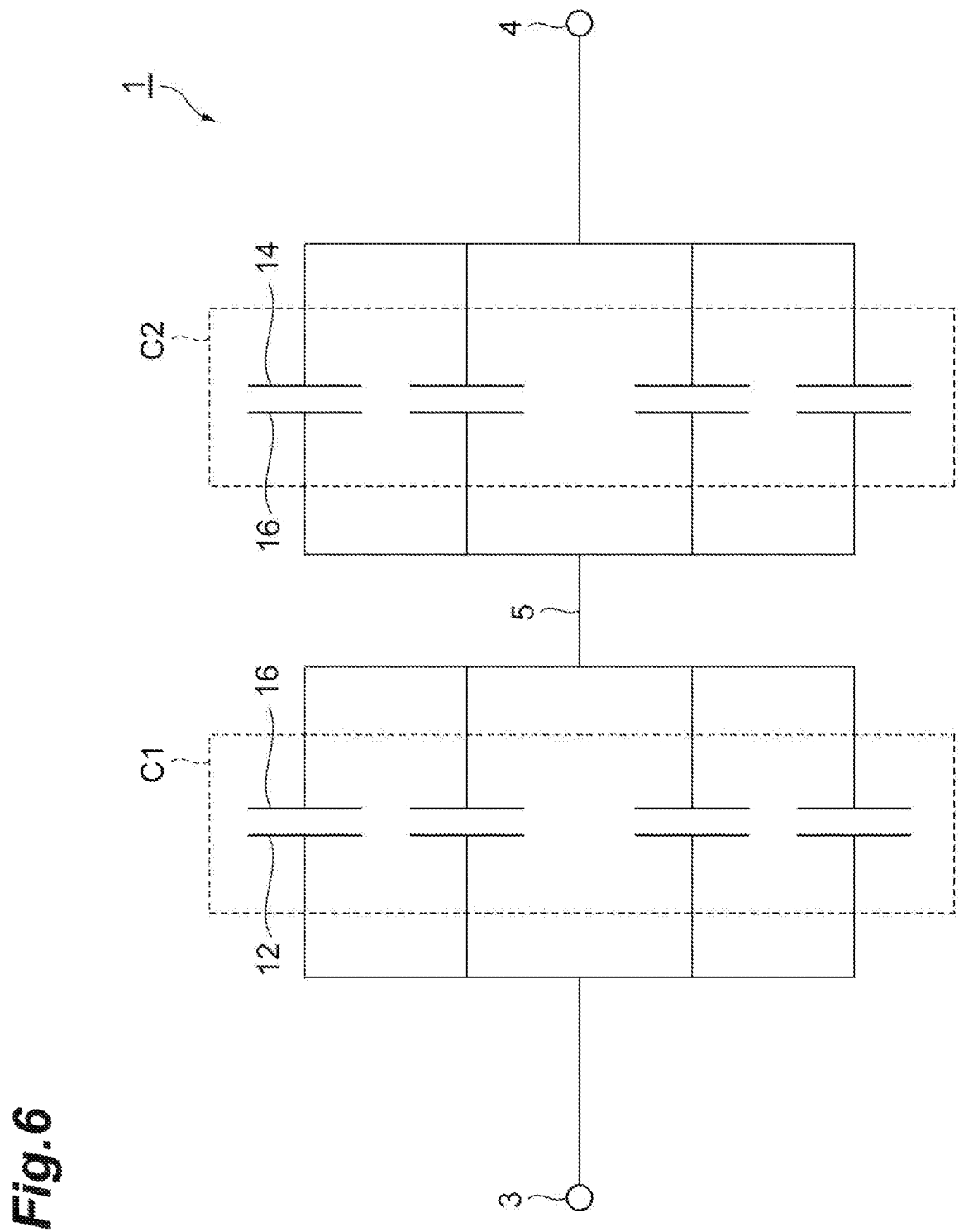
FIG. 6 is an equivalent circuit diagram of the multilayer capacitor illustrated in FIG. 1.

As illustrated in FIGS. 4 and 6, the multilayer capacitor 1 includes first capacity parts C1 and second capacity parts C2. As illustrated in FIG. 4, the first capacity parts C1 are constituted of the first internal electrodes 12 and the third internal electrodes 16 that are alternately disposed in the element 2 to face each other at an interval in the third direction D3. In the present embodiment, the first capacity parts C1 are formed in a region closer to the other lateral surface 2f than the middle of the element 2 in the third direction D3. The first capacity parts C1 constitutes a first capacitor component.

The second capacity parts C2 are constituted of the second internal electrodes 14 and the third internal electrodes 16 that are alternately disposed in the element 2 to face each other at an interval in third direction D3. In the present embodiment, the second capacity parts C2 are formed in a region closer to the one lateral surface 2e than the middle of the element 2 in the third direction D3. The second capacity parts C2 constitute a second capacitor component.

As illustrated in FIG. 6, in the multilayer capacitor 1 having the above configuration, the plurality of first capacity parts C1 are electrically connected in parallel, and the plurality of second capacity parts C2 are electrically connected in parallel. In the multilayer capacitor 1, the first capacity parts C1 and the second capacity parts C2 are electrically connected in series. To be specific, the first capacity parts C1 and the second capacity parts C2 are electrically connected in series by the plurality of third internal electrodes 16 that are electrically connected by the connection conductor 5. The number of first and second first capacity parts C1 and C2 illustrated in FIG. 6 is not necessarily identical to the number of first, second, and third internal electrodes 12, 14 and 16 illustrated in FIG. 2.

As illustrated in FIG. 7, the multilayer capacitor 1 having the above configuration is mounted on, for example, a circuit board 100 having land electrodes L1 and L2. To be specific, an electronic component device 110 in which the multilayer capacitor 1 is mounted on the circuit board 100 includes the multilayer capacitor 1 and the circuit board 100. The circuit board 100 has a board ST, and the land electrodes L1 and L2 mounted on the board ST. The circuit board 100 can further include a wiring (not shown) that is electrically connected to the land electrodes L1 and L2, a power supply, an electronic control unit (ECU), and so on.

In the electronic component device 110, the main surface (the mounting surface) 2d of the element 2 of the multilayer capacitor 1 faces downward. The electrode portion 3c of the first external electrode 3 and the land electrode L1 are disposed to face each other, and the electrode portion 4c of the second external electrode 4 and the land electrode L2 are disposed to face each other. The first external electrode 3 and the land electrode L1 are bonded by a solder S1, and the second external electrode 4 and the land electrode L2 are bonded by a solder S2. Thereby, in the electronic component device, the first external electrode 3 of the multilayer capacitor 1 and the land electrode L1 are electrically connected, and the second external electrode 4 and the land electrode L2 are electrically connected. In the electronic component device 110, the connection conductor 5 is not electrically connected to a conductor of the circuit board 100.

As described above, in the multilayer capacitor 1 according to the present embodiment, the first capacity parts C1 are constituted of the first internal electrodes 12 and the third internal electrodes 16 that are electrically connected to the first external electrode 3, and the second capacity parts C2 are constituted of the second internal electrodes 14 and the third internal electrodes 16 that are connected to the second external electrode 4. The plurality of third internal electrodes 16 are electrically connected to one another by the connection conductor 5. Thereby, the multilayer capacitor 1 has a configuration in which the first capacity parts C1 and the second capacity parts C2 (the two capacitor components) are connected in series. Therefore, in the multilayer capacitor 1, a withstand voltage characteristic can be improved.

In the multilayer capacitor 1, since the first capacity parts C1 and the second capacity parts C2 are connected in series by the plurality of third internal electrodes 16 that are electrically connected by the connection conductor 5, changes in the capacitance and the resistance value occur, for example, in the case where a failure occurs at the first capacity parts C1. For this reason, even if a failure occurs at the multilayer capacitor 1 after it is mounted, the failure can be detected.

In the multilayer capacitor 1 according to the present embodiment, the first internal electrodes 12, the second internal electrodes 14, and the third internal electrodes 16 are orthogonal to the main surface 2d of the element 2, and extend in the second direction D2. In this configuration, the connector parts 16b of the plurality of third internal electrodes 16 can be exposed at the main surface 2c. Therefore, in the multilayer capacitor 1, the connection conductor 5 can be disposed on the main surface 2c of the element 2 (on the surface that faces the mounting surface). Thereby, when the multilayer capacitor 1 is mounted, the connection conductor 5 comes into contact with the electrodes or the like of the circuit board, and occurrence of a short circuit between the first external electrode 3 and/or the second external electrode 4 and the connection conductor 5 can be inhibited. Therefore, the multilayer capacitor 1 can have a configuration in which the first capacity parts C1 and the second capacity parts C2 are connected in series.

In the multilayer capacitor 1 according to the present embodiment, the first internal electrodes 12 are disposed in the region close to the other lateral surface 2f in the element 2, and the second internal electrodes 14 are disposed in the region close to the one lateral surface 2e in the element 2. Thereby, in the multilayer capacitor 1, the first capacity parts C1 are formed in the region close to the other lateral surface 2f, and the second capacity parts C2 are formed in the region close to the one lateral surface 2e. For this reason, in the multilayer capacitor 1, for example, even in the case where cracks occur at the element 2, breakage occurs at the one internal electrodes, and the one capacity parts does not function, the other capacity parts can be protected. In this way, some of the capacity parts can be protected in the multilayer capacitor 1 even in the case where the cracks occur at the element 2.

While the first embodiment has been described, the present invention is not necessarily limited to the aforementioned embodiment, and may be modified in various ways without departing from the spirit or teaching thereof.

Figure 8:
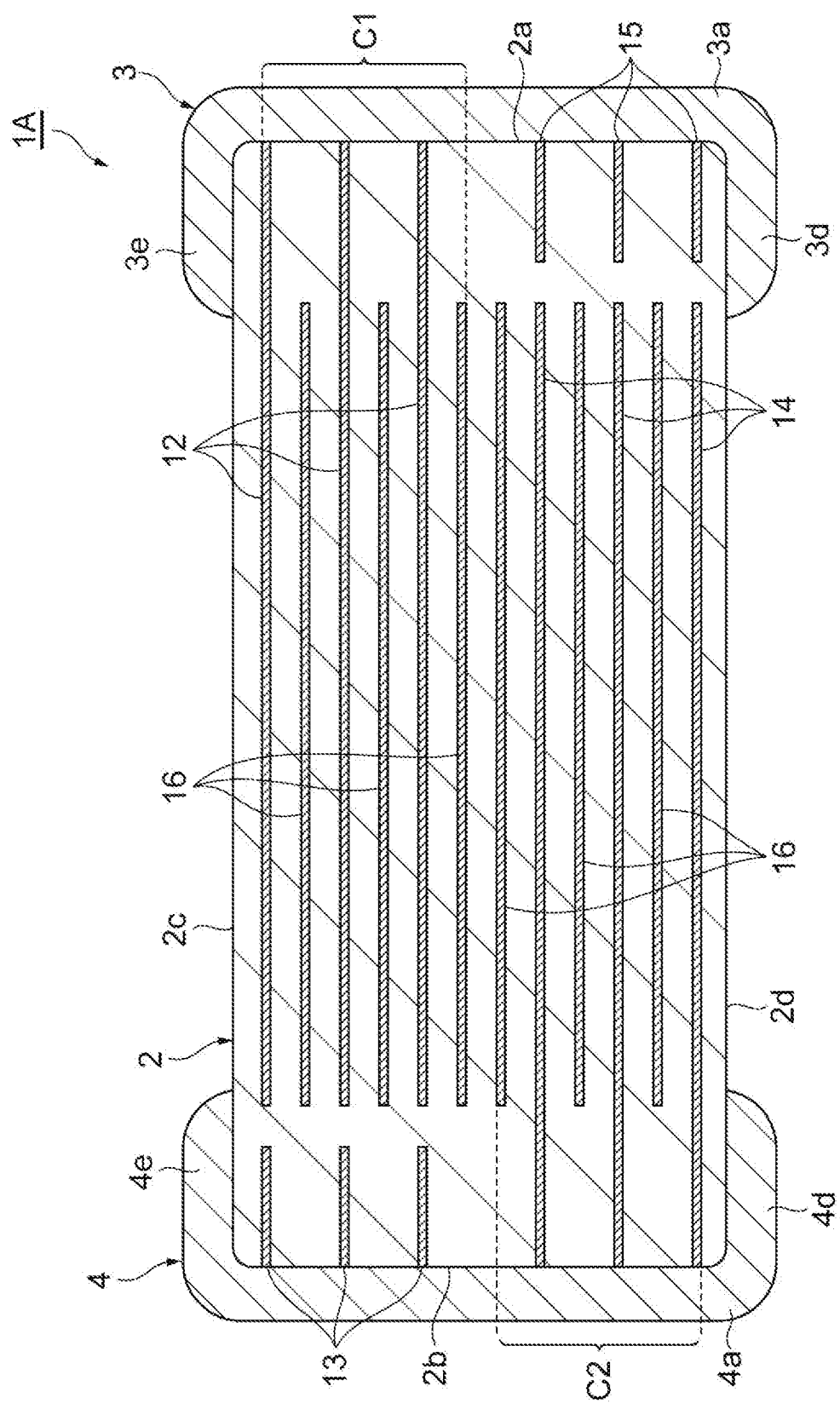
FIG. 8 is a view illustrating a sectional configuration of a multilayer capacitor according to a modification of the first embodiment.

In the above embodiment, as illustrated in FIG. 4, the configuration in which the first internal electrodes 12 and the second internal electrodes 14 are disposed to face each other in the middle of the element 2 in the third direction D3 has been described by way of example. However, as illustrated in FIG. 8, a pair of third internal electrodes 16 may be disposed between the first internal electrode 12 and the second internal electrode 14 to face each other. In the multilayer capacitor 1A having this configuration, no capacity parts are formed between the first capacity parts C1 and the second capacity parts C2. Therefore, the configuration in which the first capacity parts C1 and the second capacity parts C2 are electrically connected in series can be easily realized.

Figure 9:
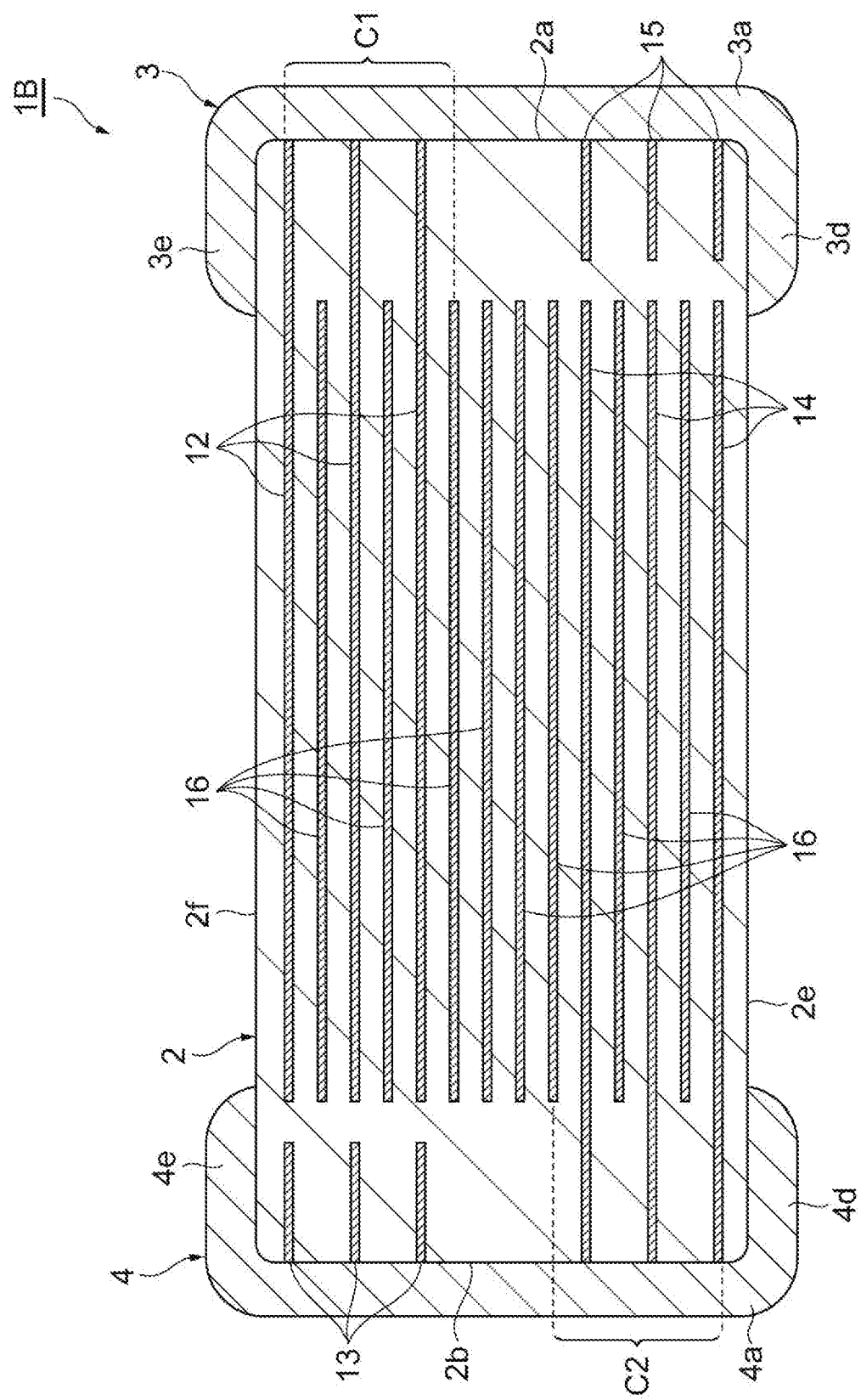
FIG. 9 is a view illustrating a sectional configuration of a multilayer capacitor according to a modification of the first embodiment.

As illustrated in FIG. 9, a plurality of third internal electrodes 16 (four third internal electrodes in the present embodiment) may be disposed between the first internal electrode 12 and the second internal electrode 14. In the multilayer capacitor 1B having this configuration, for example, even in the case where breakage occurs at the first internal electrodes 12 that constitute the first capacity parts C1, this breakage can be inhibited from propagating to the second internal electrodes 14 that constitute the second capacity parts C2 due to the third internal electrodes 16. In the multilayer capacitor 1, even in the case where cracks occur at the element 2, some of the capacity parts can be protected.

Figure 10:
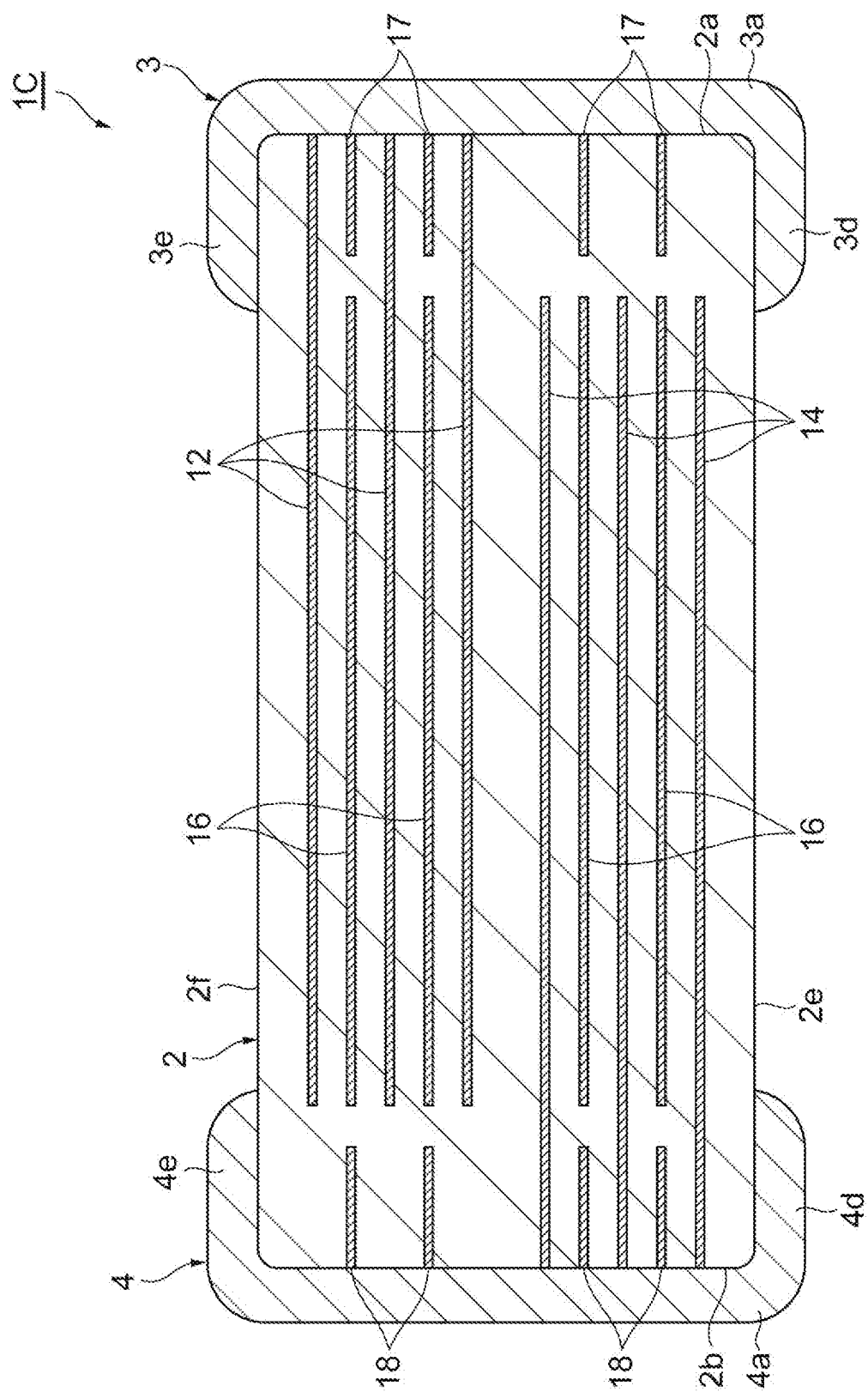
FIG. 10 is a view illustrating a sectional configuration of a multilayer capacitor according to a modification of the first embodiment.

In the above embodiment, the configuration in which the first dummy electrodes 13 are disposed at the same positions as the first internal electrodes 12 and the second dummy electrodes 15 are disposed at the same positions as the second internal electrodes 14 has been described by way of example. However, the dummy electrodes may be disposed at the same positions as at least one of the first internal electrodes 12 and the second internal electrodes 14. As in a multilayer capacitor 1C illustrated in FIG. 10, third dummy electrodes 17 and fourth dummy electrodes 18 may be disposed at the same positions as the third internal electrodes 16. At least one of the third dummy electrodes 17 and the fourth dummy electrodes 18 may be disposed at the same positions as the third internal electrodes 16. The dummy electrodes may be disposed at the same positions as the first internal electrodes 12, the second internal electrodes 14 and the third internal electrodes 16. In addition, the dummy electrodes may not be disposed.

In the above embodiment, the configuration in which the plurality of first internal electrodes 12 are disposed in the region close to the lateral surface 2f and the plurality of second internal electrodes 14 are disposed in the region close to the lateral surface 2e has been described by way of example. That is, the configuration in which the first capacity parts C1 are formed in the region close to the lateral surface 2f and the second capacity parts C2 are formed in the region close to the lateral surface 2e has been described by way of example. However, the plurality of first internal electrodes 12 may be disposed in the region close to the lateral surface 2e, and the plurality of second internal electrodes 14 may be disposed in the region close to the lateral surface 2f.

Second Embodiment

Figure 11:
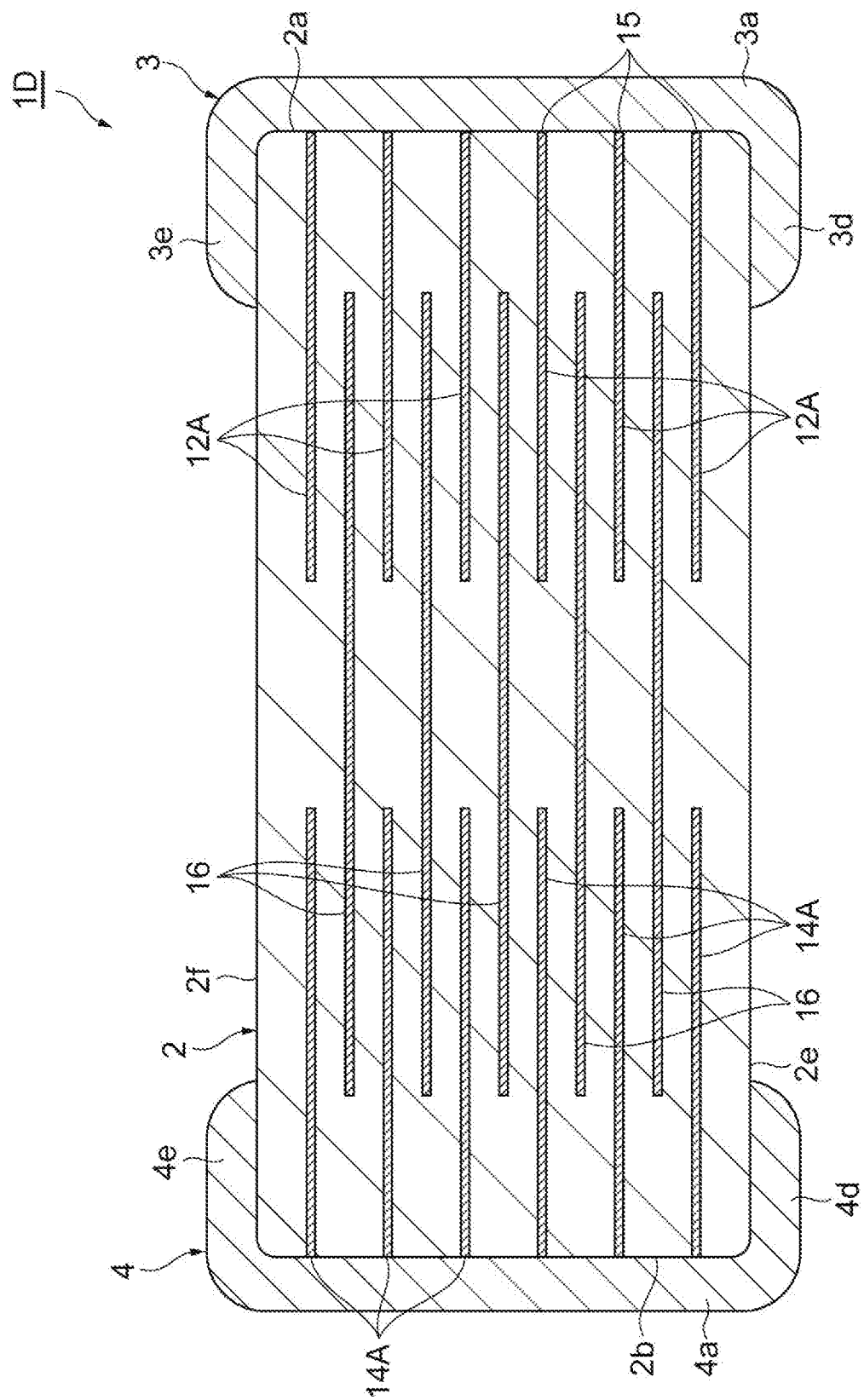
FIG. 11 is a view illustrating a sectional configuration of a multilayer capacitor according to a second embodiment.

Next, a multilayer capacitor according to a second embodiment will be described. As illustrated in FIG. 11, the multilayer capacitor 1D according to the second embodiment includes an element 2, and a first external electrode 3, second external electrode 4, and a connection conductor 5 that are disposed on an outer surface of the element 2.

The multilayer capacitor 1D includes a plurality of first internal electrodes 12A, a plurality of second internal electrodes 14A, and a plurality of third internal electrodes 16 that act as internal conductors disposed in the element 2. In the present embodiment, the number of the plurality of first internal electrodes 12A (here, six) is the same as that of the plurality of second internal electrodes 14A.

The first internal electrodes 12A and the second internal electrodes 14A are disposed at the same positions (layers) in a third direction D3 of the element 2. The first internal electrodes 12A and the second internal electrodes 14A are disposed alternately with the third internal electrodes 16 in the element 2 to face each other at intervals in a first direction D1.

The plurality of first internal electrodes 12A are disposed in a region close to one end face 2a in a second direction D2 of the element 2. In the present embodiment, the plurality of first internal electrodes 12A are disposed in the region closer to the one end face 2a than the middle of the element 2 in the second direction D2. The first internal electrodes 12A extend in a direction perpendicular to a main surface 2d that is a mounting surface of the element 2.

Figure 12:
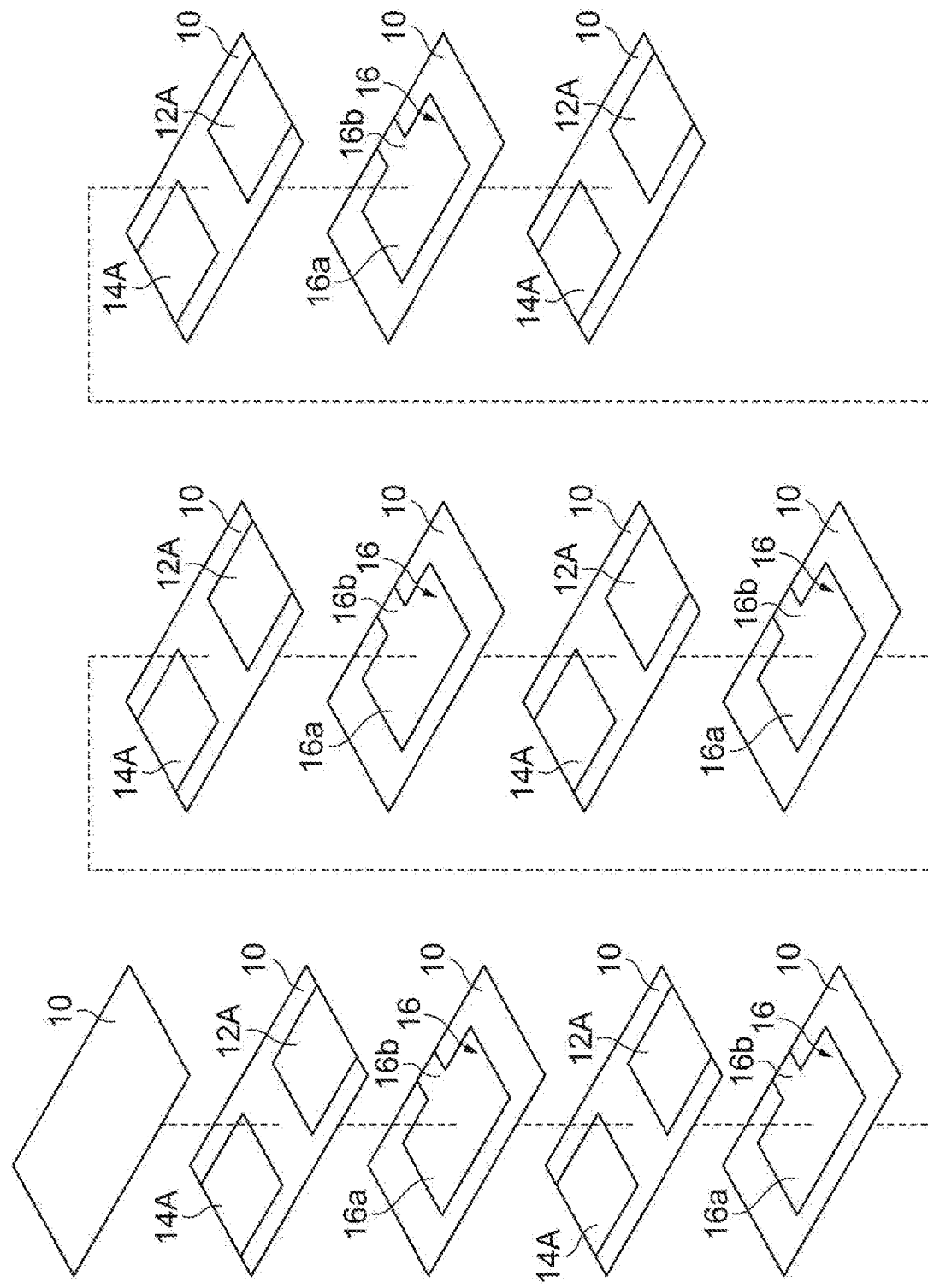
FIG. 12 is an exploded perspective view of an element of the multilayer capacitor illustrated in FIG. 11.

As illustrated in FIG. 12, one ends of the first internal electrodes 12A are exposed at the one end face 2a. The other ends of the first internal electrodes 12A are separated from the second internal electrodes 14A at a predetermined interval. The first internal electrodes 12A are not exposed at the other end face 2b, a pair of main surfaces 2c and 2d, and a pair of lateral surfaces 2e and 2f. The ends of the first internal electrodes 12A which are exposed at the one end face 2a are electrically connected to the first external electrode 3.

The plurality of second internal electrodes 14A are disposed in a region close to the other end face 2b in the second direction D2 of the element 2. In the present embodiment, the plurality of second internal electrodes 14A are disposed in the region closer to the other end face 2b than the middle of the element 2 in the second direction D2. The second internal electrodes 14A extend in the direction perpendicular to the main surface 2d that is the mounting surface of the element 2. In the present embodiment, the second internal electrodes 14A have the same shapes and dimensions as the first internal electrodes 12A.

One ends of the second internal electrodes 14A are exposed at the other end face 2b. The other ends of the second internal electrodes 14A are separated from the first internal electrodes 12A at a predetermined interval. The second internal electrodes 14A are not exposed at the one end face 2a, the pair of main surfaces 2c and 2d, and the pair of lateral surfaces 2e and 2f. The ends of the second internal electrodes 14A which are exposed at the other end face 2b are electrically connected to the second external electrode 4.

Each of the third internal electrodes 16 includes a main electrode part 16a and a connector part 16b. The main electrode parts 16a face the first internal electrodes 12A and the second internal electrodes 14A via a part (dielectric layers 10) of the element 2 in the third direction D3.

Figure 13:
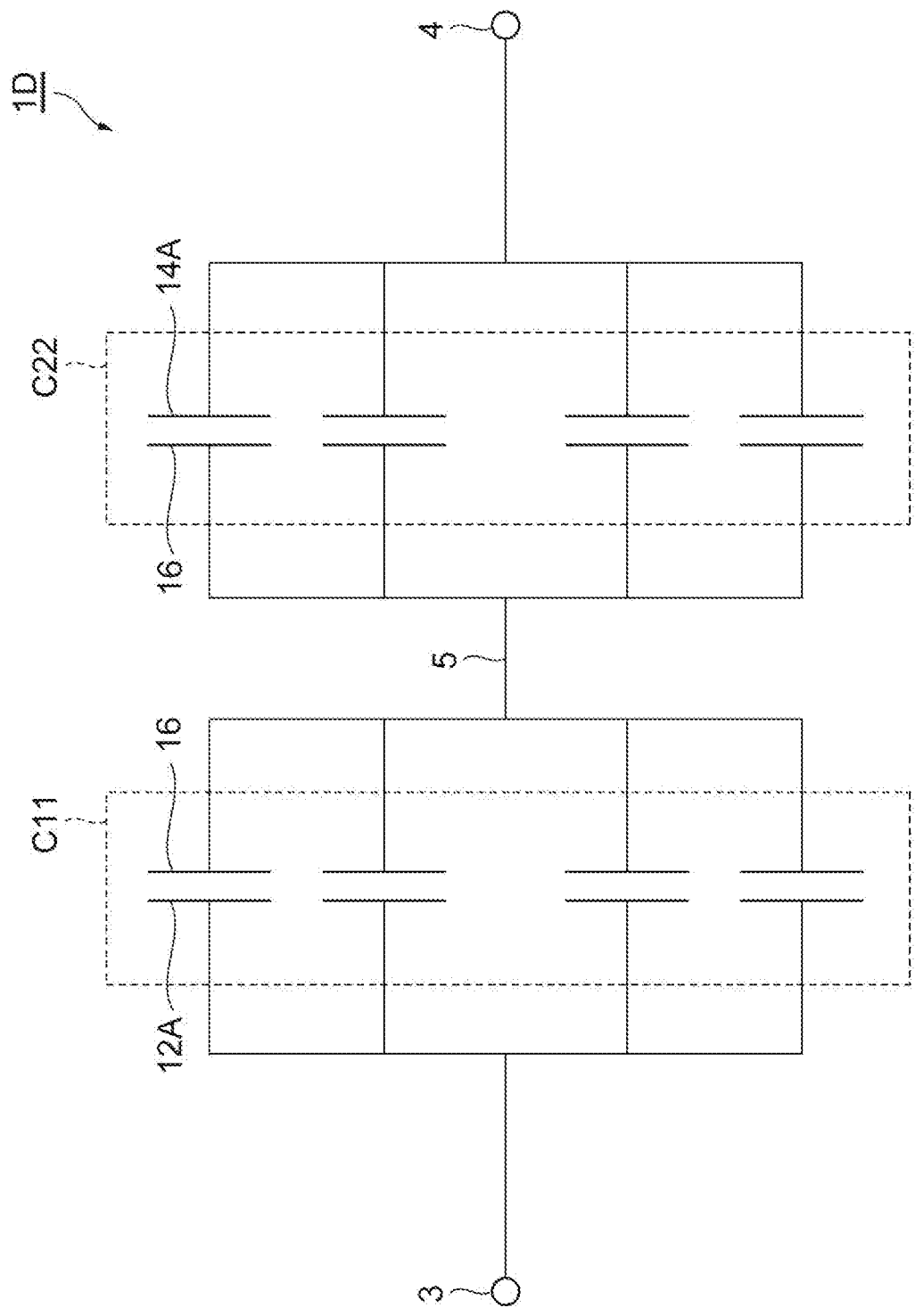
FIG. 13 is an equivalent circuit diagram of the multilayer capacitor illustrated in FIG. 11.

As illustrated in FIG. 13, the multilayer capacitor 1D includes first capacity parts C11 and second capacity parts C22. The first capacity parts C11 are constituted of the first internal electrodes 12A and the third internal electrodes 16 that are alternately disposed in the element 2 to face each other at an interval in the third direction D3. In the present embodiment, the first capacity parts C11 are formed in a region closer to the one end face 2a than the middle of the element 2 in the second direction D2. The first capacity parts C11 constitutes a first capacitor component.

The second capacity parts C22 are constituted of the second internal electrodes 14A and the third internal electrodes 16 that are alternately disposed in the element 2 to face each other at an interval in third direction D3. In the present embodiment, the second capacity parts C22 are formed in a region closer to the other end face 2b than the middle of the element 2 in the second direction D2. The second capacity parts C22 constitute a second capacitor component.

In the multilayer capacitor 1D, the plurality of first capacity parts C11 are electrically connected in parallel, and the plurality of second capacity part C22 are electrically connected in parallel. In the multilayer capacitor 1D, the first capacity parts C11 and the second capacity part C22 are electrically connected in series. To be specific, the first capacity parts C11 and the second capacity parts C22 are electrically connected in series by the plurality of third internal electrodes 16 that are electrically connected by the connection conductor 5. The number of first and second first capacity parts C11 and C22 illustrated in FIG. 13 is not necessarily identical to the number of first, second, and third internal electrodes 12A, 14A and 16 illustrated in FIG. 11.

As described above, in the multilayer capacitor 1D according to the present embodiment, the first capacity parts C11 are constituted of the first internal electrodes 12A and the third internal electrodes 16 that are electrically connected to the first external electrode 3, and the second capacity parts C22 are constituted of the second internal electrodes 14A and the third internal electrodes 16 that are connected to the second external electrode 4. The plurality of third internal electrodes 16 are electrically connected to one another by the connection conductor 5. Thereby, the multilayer capacitor 1D has a configuration in which the two capacitor components are connected in series. Therefore, in the multilayer capacitor 1D, a withstand voltage characteristic is improved.

In the multilayer capacitor 1D, since the first capacity parts C11 and the second capacity parts C22 are connected in series by the plurality of third internal electrodes 16 that are electrically connected by the connection conductor 5, changes in a capacitance and a resistance value occur, for example, in the case where a failure occurs at the first capacity parts C11. For this reason, even if a failure occurs at the multilayer capacitor 1D after it is mounted, the failure can be detected.

In the multilayer capacitor 1D according to the present embodiment, the first internal electrodes 12A are disposed in the region close to the one end face 2a in the element 2, and the second internal electrodes 14A are disposed in the region close to the other end face 2b in the element 2. Thereby, in the multilayer capacitor 1D, the first capacity parts C11 are formed in the region close to the one end face 2a, and the second capacity parts C22 are formed in the region close to the other end face 2b. Thus, in the multilayer capacitor 1D, for example, even in the case where cracks occur at the element 2 and the one internal electrodes are broken, breakage of the other internal electrodes can be avoided. Therefore, in the multilayer capacitor 1D, even in the case where the cracks occur at the element 2, some of the capacity parts can be protected.

Third Embodiment

Figure 14:
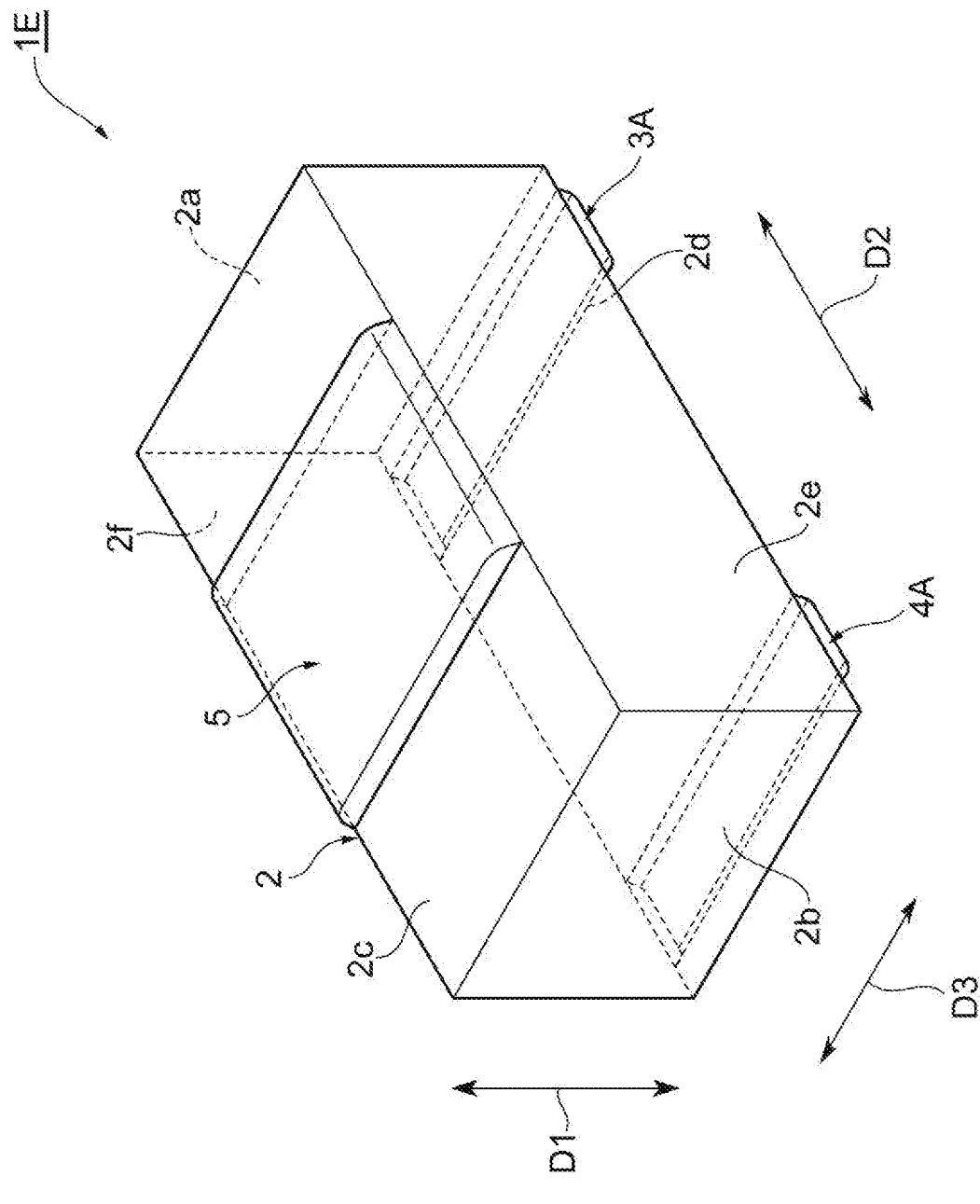
FIG. 14 is a perspective view of a multilayer capacitor according to a third embodiment.

Next, a multilayer capacitor according to a third embodiment will be described. As illustrated in FIG. 14, the multilayer capacitor 1E according to the third embodiment includes an element 2, and a first external electrode 3A, a second external electrode 4A, and a connection conductor 5 that are disposed on an outer surface of the element 2.

Figure 15A:
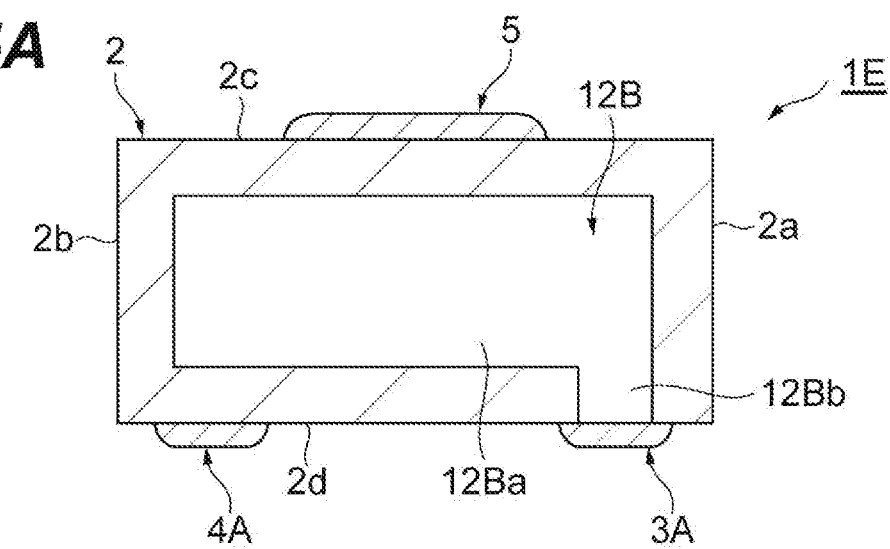
FIG. 15A is a view illustrating a sectional configuration of the multilayer capacitor illustrated in FIG. 14.
Figure 15B:
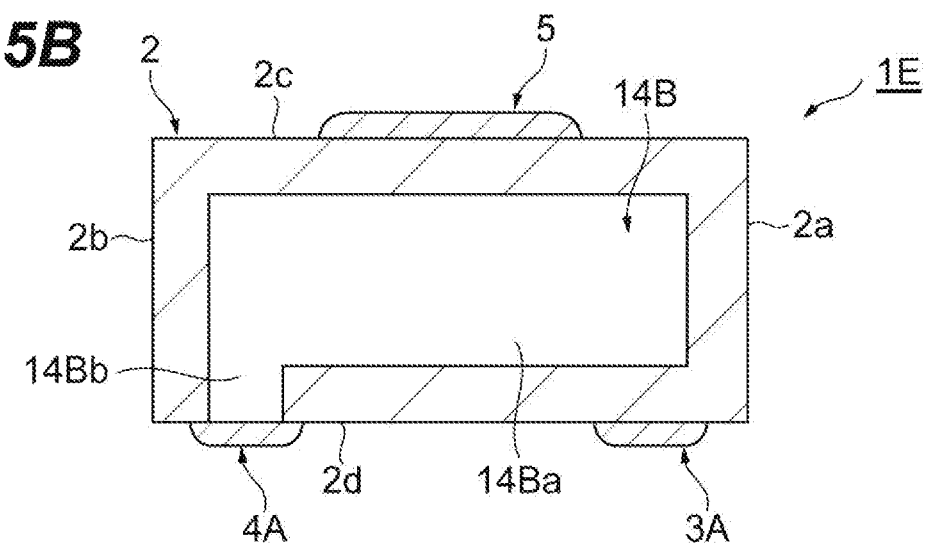
FIG. 15B is a view illustrating a sectional configuration of the multilayer capacitor illustrated in FIG. 14.
Figure 15C:
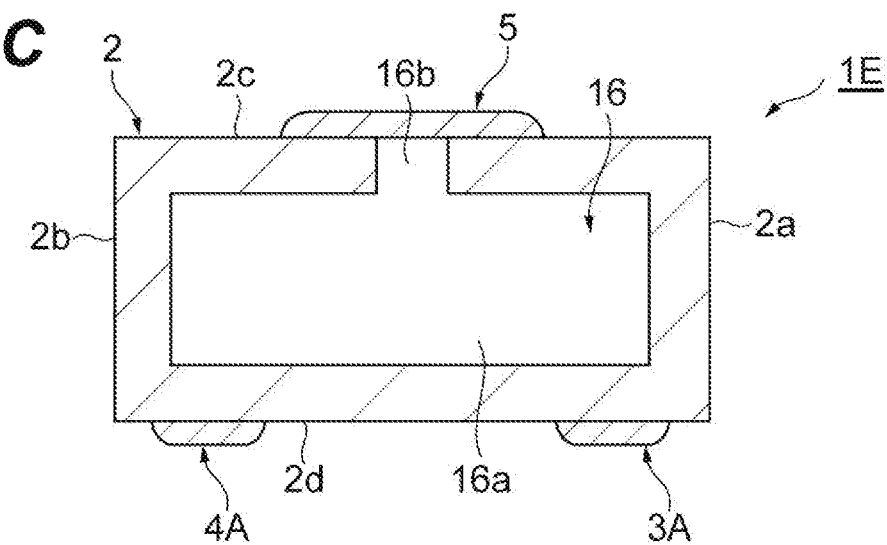
FIG. 15C is a view illustrating a sectional configuration of the multilayer capacitor illustrated in FIG. 14.

As illustrated in FIG. 15A, 15B or 15C, the multilayer capacitor 1E includes a plurality of first internal electrodes 12B, a plurality of second internal electrodes 14B, and a plurality of third internal electrodes 16 that act as internal conductors disposed in the element 2.

As illustrated in FIG. 15A, each of the first internal electrodes 12B includes a main electrode part 12Ba and a connector part 12Bb. Each of the main electrode parts 12Ba has a rectangular shape in which a second direction D2 is a long side direction and a first direction D1 is a short side direction. The connector parts 12Bb extend from one sides (one long sides) of the main electrode parts 12Ba, and are exposed at the other main surface 2d. The connector parts 12Bb are disposed close to one end face 2a at the main electrode parts 12Ba. The first internal electrodes 12B are exposed at the other main surface 2d, and are not exposed at a pair of end faces 2a and 2b, one main surface 2c, and a pair of lateral surfaces 2e and 2f. The main electrode part 12Ba and the connector part 12Bb are integrally formed. The connector parts 12Bb of the first internal electrodes 12B which are exposed at the other main surface 2d are electrically connected to the first external electrode 3A.

As illustrated in FIG. 15B, each of the second internal electrodes 14B includes a main electrode part 14Ba and a connector part 14Bb. Each of the main electrode parts 14Ba has a rectangular shape in which the second direction D2 is a long side direction and the first direction D1 is a short side direction. The connector parts 14Bb extend from one sides (one long sides) of the main electrode parts 14Ba, and are exposed at the other main surface 2d. The connector parts 14Bb are disposed close to the other end face 2b at the main electrode parts 14Ba. The second internal electrodes 14B are exposed at the other main surface 2d, and are not exposed at the pair of end faces 2a and 2b, the one main surface 2c, and the pair of lateral surfaces 2e and 2f. The main electrode part 14Ba and the connector part 14Bb are integrally formed. The connector parts 14Bb of the second internal electrodes 14B which are exposed at the other main surface 2d are electrically connected to the second external electrode 4A.

As illustrated in FIG. 15C, each of the third internal electrodes 16 includes a main electrode part 16a and a connector part 16b. The main electrode part 16a face the first internal electrodes 12B and the second internal electrodes 14B via a part (dielectric layers 10) of the element 2 in a third direction D3.

As illustrated in FIG. 14, the first external electrode 3A is disposed on the other main surface 2d. The first external electrode 3A is disposed close to the one end face 2a. To be specific, the first external electrode 3A is disposed closer to the one end face 2a than the middle of the element 2 in the second direction D2. In the present embodiment, the first external electrode 3A is continuously disposed from the one lateral surface 2e to the other lateral surface 2f. As illustrated in FIG. 15A, the first external electrode 3A is disposed to cover all the portions of the first internal electrodes 12B which are exposed at the main surface 2d, and the first internal electrodes 12B are directly connected to the first external electrode 3A.

As illustrated in FIG. 14, the second external electrode 4A is disposed on the other main surface 2d. The second external electrode 4A is disposed close to the other end face 2b. To be specific, the second external electrode 4A is disposed closer to the other end face 2b than the middle of the element 2 in the second direction D2. In the present embodiment, the second external electrode 4A is continuously disposed from the one lateral surface 2e to the other lateral surface 2f. As illustrated in FIG. 15B, the second external electrode 4A is disposed to cover all the portions of the second internal electrodes 14B which are exposed at the main surface 2d, and the second internal electrodes 14B are directly connected to the second external electrode 4A.

As illustrated in FIG. 14, the connection conductor 5 is disposed in the middle of the one main surface 2c in the second direction D2. As illustrated in FIG. 15C, the connection conductor 5 is disposed to cover all the portions of the connector parts 16b of the third internal electrodes 16 which are exposed at the main surface 2c, and the connector parts 16b are directly connected to the connection conductor 5. That is, the connector parts 16b connect the main electrode parts 16a and the connection conductor 5. Thereby, each of the third internal electrodes 16 is electrically connected to the connection conductor 5.

Like the multilayer capacitor 1 of the first embodiment, the multilayer capacitor 1E includes first capacity parts C1 and second capacity parts C2 (see FIG. 6). In the multilayer capacitor 1E, the plurality of first capacity parts C1 are electrically connected in parallel, and the plurality of second capacity parts C2 are electrically connected in parallel. In the multilayer capacitor 1E, the first capacity parts C1 and the second capacity parts C2 are electrically connected in series. To be specific, the first capacity parts C1 and the second capacity part C2 are electrically connected in series by the plurality of third internal electrodes 16 that are electrically connected by the connection conductor 5.

As described above, in the multilayer capacitor 1E according to the present embodiment, like the multilayer capacitor 1 according to the first embodiment, a failure can be detected while improving a withstand voltage characteristic.

In the multilayer capacitor 1E according to the present embodiment, the first external electrode 3A and the second external electrode 4A are disposed on the main surface 2d of the element 2 which is a mounting surface, and the connection conductor 5 is disposed on the main surface 2c that faces the main surface 2d. Thereby, when the multilayer capacitor 1E is mounted, the connection conductor 5 comes into contact with electrodes or the like of a circuit board, and occurrence of a short circuit between the first external electrode 3A and/or the second external electrode 4A and the connection conductor 5 can be inhibited. Therefore, the multilayer capacitor 1E can have a configuration in which the first capacity parts C1 and the second capacity parts C2 are connected in series.

Fourth Embodiment

Figure 16A:
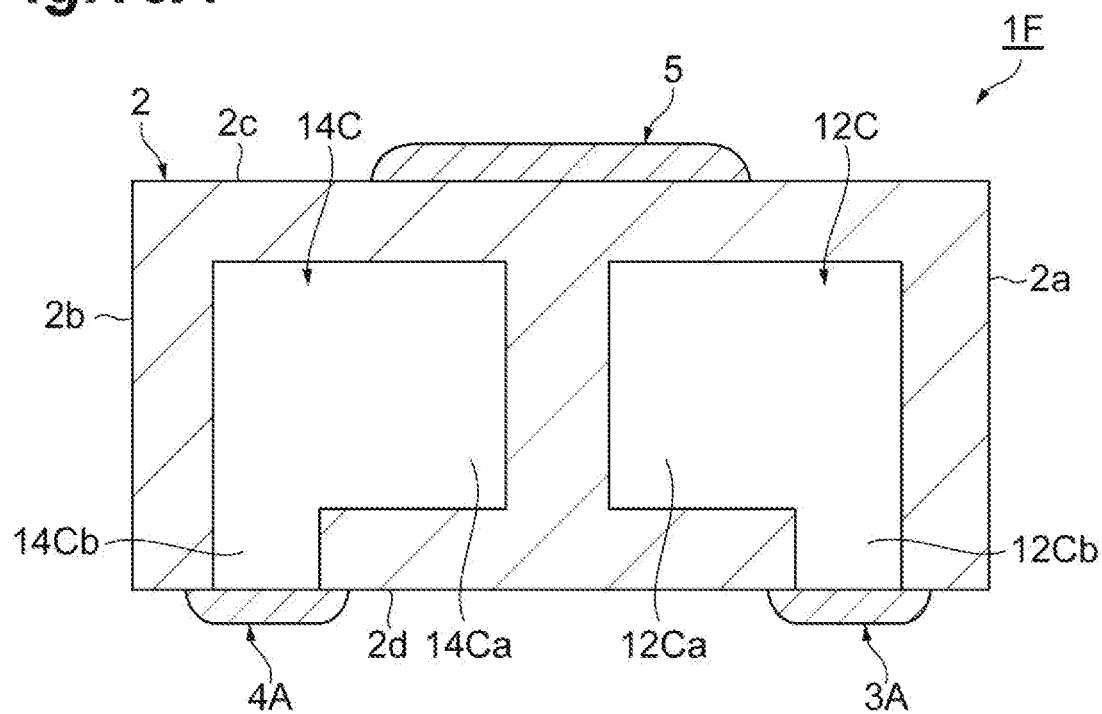
FIG. 16A is a view illustrating a sectional configuration of a multilayer capacitor according to a fourth embodiment.
Figure 16B:
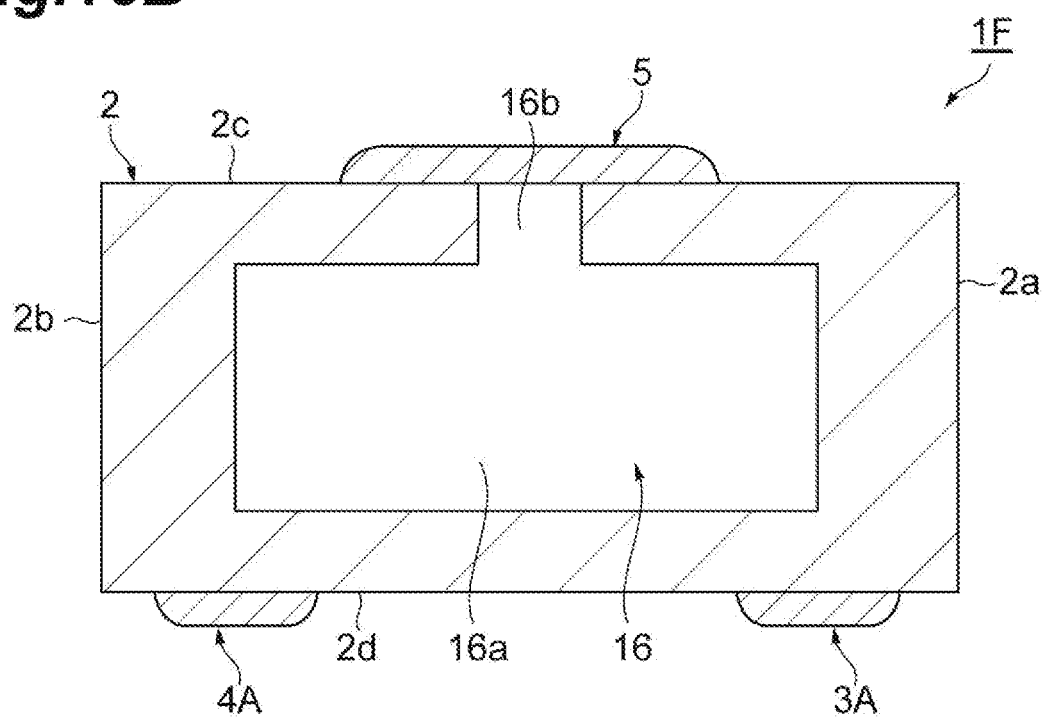
FIG. 16B is a view illustrating a sectional configuration of the multilayer capacitor according to the fourth embodiment.

Next, a multilayer capacitor according to a fourth embodiment will be described. As illustrated in FIGS. 16A and 16B, the multilayer capacitor 1F according to the fourth embodiment includes an element 2, and a first external electrode 3A, a second external electrode 4A, and a connection conductor 5 that are disposed on an outer surface of the element 2.

The multilayer capacitor 1F includes a plurality of first internal electrodes 12C, a plurality of second internal electrodes 14C, and a plurality of third internal electrodes 16 that act as internal conductors disposed in the element 2.

As illustrated in FIG. 16A, the plurality of first internal electrodes 12C are disposed in a region close to one end face 2a in a second direction D2 of the element 2. In the present embodiment, the plurality of first internal electrodes 12C are disposed in the region closer to the one end face 2a than the middle of the element 2 in the second direction D2.

Each of the first internal electrodes 12C includes a main electrode part 12Ca and a connector part 12Cb. The first internal electrodes 12C extend in a direction perpendicular to a main surface 2d that is a mounting surface of the element 2. Each of the main electrode parts 12Ca has a rectangular shape. The connector parts 12Cb extend from one sides (one long sides) of the main electrode parts 12Ca, and are exposed at the other main surface 2d. The connector parts 12Cb are disposed close to the one end face 2a at the main electrode part 12Ca. The first internal electrodes 12C are exposed at the other main surface 2d, and are not exposed at a pair of end faces 2a and 2b, one main surface 2c, and a pair of lateral surfaces 2e and 2f. The main electrode part 12Ca and the connector part 12Cb are integrally formed. The connector parts 12Cb of the first internal electrodes 12C which are exposed at the other main surface 2d are electrically connected to the first external electrode 3A.

A plurality of second internal electrodes 14C are disposed in a region close to the other end face 2b in a second direction D2 of the element 2. In the present embodiment, the plurality of second internal electrodes 14C are disposed in the region closer to the other end face 2b than the middle of the element 2 in the second direction D2. In the present embodiment, the second internal electrodes 14C have the same shape and dimensions as the first internal electrodes 12C.

Each of the second internal electrodes 14C includes a main electrode part 14Ca and a connector part 14Cb. The second internal electrodes 14C extend in a direction perpendicular to the main surface 2d that is the mounting surface of the element 2. Each of the main electrode parts 14Ca has a rectangular shape. The connector parts 14Cb extend from one sides (one long sides) of the main electrode parts 14Ca, and are exposed at the other main surface 2d. The connector parts 14Cb are disposed close to the other end face 2b at the main electrode part 14Ca. The second internal electrodes 14C are exposed at the other main surface 2d, and are not exposed at the pair of end faces 2a and 2b, the one main surface 2c, and the pair of lateral surfaces 2e and 2f. The main electrode part 14Ca and the connector part 14Cb are integrally formed. The connector parts 14Cb of the second internal electrodes 14C which are exposed at the other main surface 2d are electrically connected to the second external electrode 4A.

Like the multilayer capacitor 1D according to the second embodiment, the multilayer capacitor 1F includes first capacity parts C11 and second capacity parts C22. In the multilayer capacitor 1F, the plurality of first capacity parts C11 are electrically connected in parallel, and the plurality of second capacity parts C22 are electrically connected in parallel. In the multilayer capacitor 1F, the first capacity parts C11 and the second capacity parts C22 are electrically connected in series. To be specific, the first capacity parts C11 and the second capacity part C22 are electrically connected in series by the plurality of third internal electrodes 16 that are electrically connected by the connection conductor 5.

As described above, in the multilayer capacitor 1F according to the present embodiment, like the multilayer capacitor 1D according to the second embodiment, a failure can be detected while improving a withstand voltage characteristic. In the multilayer capacitor 1F, the first external electrode 3A and the second external electrode 4A are disposed on the main surface 2d of the element 2 which is the mowing surface, and the connection conductor 5 is disposed on the main surface 2c that faces the main surface 2d. Thereby, when the multilayer capacitor 1F is mounted, the connection conductor 5 comes into contact with electrodes or the like of a circuit board, and occurrence of a short circuit between the first external electrode 3A and/or the second external electrode 4A and the connection conductor 5 can be inhibited. Therefore, the multilayer capacitor 1F can have a configuration in which the first capacity parts C11 and the second capacity parts C22 are connected in series.

Fifth Embodiment

Figure 17A:
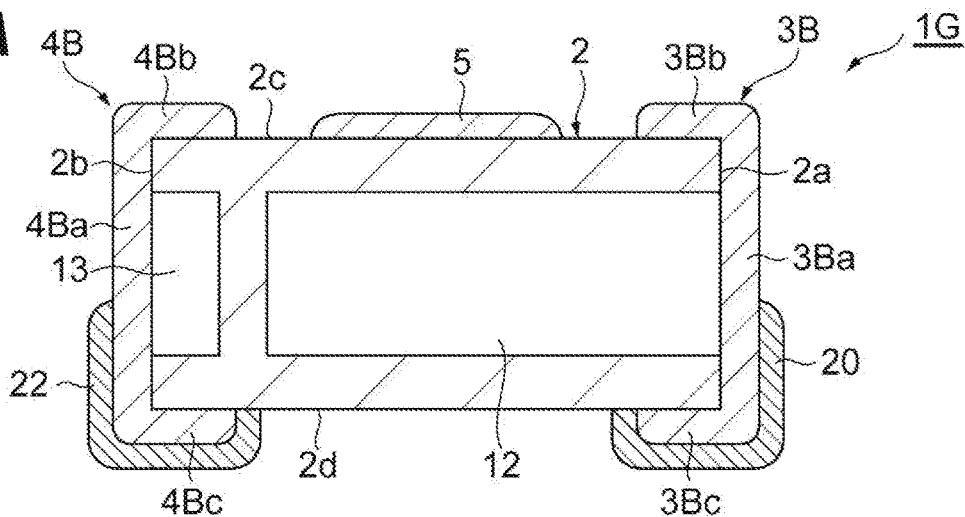
FIG. 17A is a view illustrating a sectional configuration of a multilayer capacitor according to a fifth embodiment.
Figure 17B:
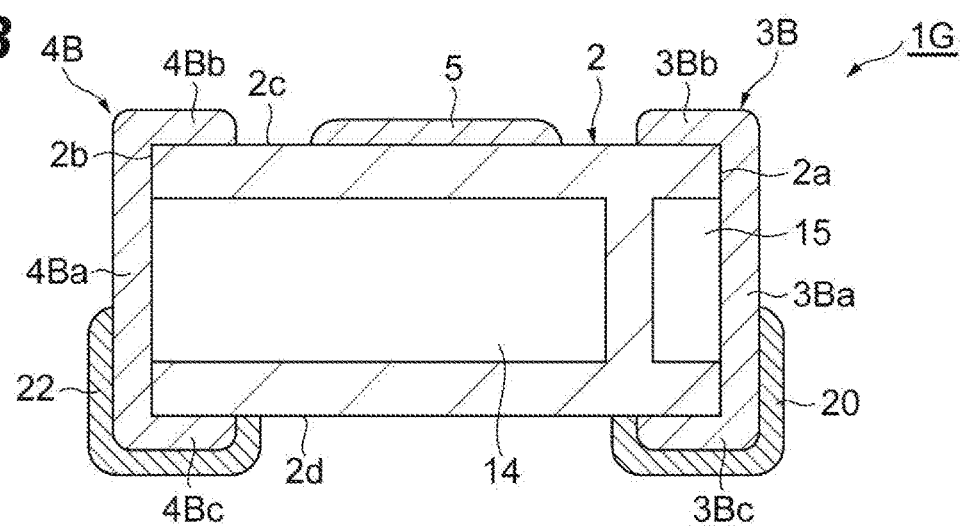
FIG. 17B is a view illustrating a sectional configuration of the multilayer capacitor according to the fifth embodiment.
Figure 17C:
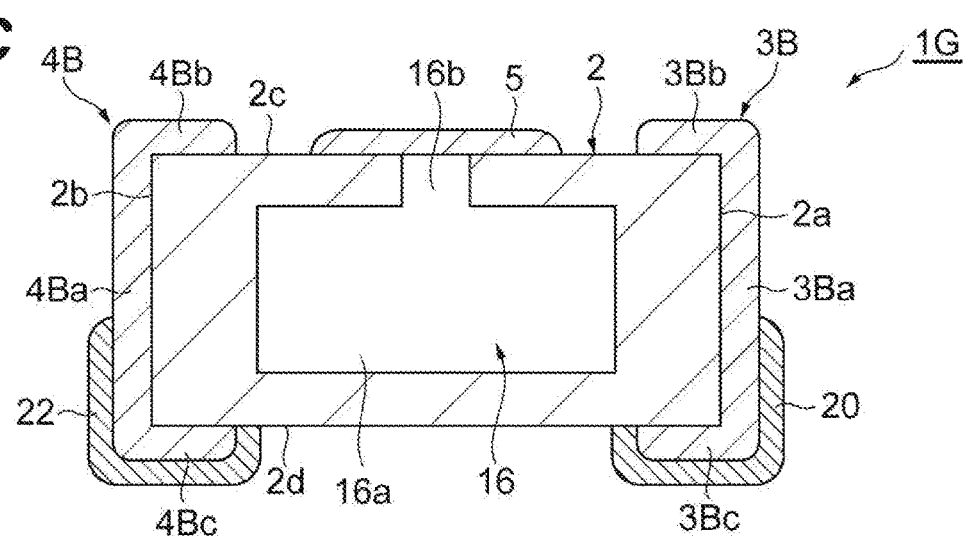
FIG. 17C is a view illustrating a sectional configuration of the multilayer capacitor according to the fifth embodiment.

Next, a multilayer capacitor according to a fifth embodiment will be described. As illustrated in FIGS. 17A, 17B, and 17C, the multilayer capacitor 1G according to the fifth embodiment includes an element 2, and a first external electrode 3B, a second external electrode 4B, and a connection conductor 5 that are disposed on an outer surface of the element 2.

The multilayer capacitor 1G includes a plurality of first internal electrodes 12, a plurality of second internal electrodes 14, and a plurality of third internal electrodes 16 that act as internal conductors disposed in the element 2.

The first external electrode 3B has a resin electrode layer 20. The resin electrode layer 20 is formed as a sintered compact of conductive paste having conductivity. The resin electrode layer 20 is partly disposed on the first external electrode 3B. To be specific, the resin electrode layer 20 is disposed close to a main surface 2d of the element 2 which is a mounting surface. In the present embodiment, the resin electrode layer 20 is disposed closer to the main surface 2d than the middle of the element 2 in a first direction D1. The resin electrode layer 20 is disposed, for example, at a part of an electrode portion 3Ba of the first external electrode 3B which is close to the main surface 2d and an electrode portion 3Bc of the first external electrode 3B. The resin electrode layer 20 is not disposed at an electrode portion 3Bb of the first external electrode 3B. That is, the resin electrode layer 20 is not disposed on a main surface 2c of the element 2 which faces the main surface 2d that is the mounting surface. A plating layer may be formed on the resin electrode layer 20.

The second external electrode 4B has a resin electrode layer 22. The resin electrode layer 22 is formed as a sintered compact of conductive paste having conductivity. The resin electrode layer 22 is partly disposed on the second external electrode 4B. To be specific, the resin electrode layer 22 is disposed close to the main surface 2d of the element 2 which is the mounting surface. In the present embodiment, the resin electrode layer 22 is disposed closer to the main surface 2d than the middle of the element 2 in the first direction D1. The resin electrode layer 22 is disposed at a part of an electrode portion 4Ba of the second external electrode 4B which is close to the main surface 2d and an electrode portion 4Bc of the second external electrode 4B. The resin electrode layer 22 is not disposed at an electrode portion 4Bb of the second external electrode 4B. That is, the resin electrode layer 22 is not disposed on the main surface 2c of the element 2 which faces the main surface 2d that is the mounting surface. A plating layer may be formed on the resin electrode layer 22.

Like the multilayer capacitor 1 of the first embodiment, the multilayer capacitor 1G includes first capacity parts C1 and second capacity parts C2 (see FIG. 6). In the multilayer capacitor 1G, the plurality of first capacity parts C1 are electrically connected in parallel, and the plurality of second capacity parts C2 are electrically connected in parallel. In the multilayer capacitor 1G, the first capacity parts C1 and the second capacity parts C2 are electrically connected in series. To be specific, the first capacity parts C1 and the second capacity parts C2 are electrically connected in series by the plurality of third internal electrodes 16 that are electrically connected by the connection conductor 5.

As described above, in the multilayer capacitor 1G according to the present embodiment, like the multilayer capacitor 1 according to the first embodiment, the occurrence of a failure can be detected while a withstand voltage characteristic is improved.

In the multilayer capacitor 1G according to the present embodiment, the first external electrode 3B and the second external electrode 4B have the resin electrode layers 20 and 22. The resin electrode layers 20 and 22 have durability against a thermal shock. For this reason, for example, as illustrated in FIG. 7, when the multilayer capacitor 1G is mounted on a circuit board 100, even in the case where solders S1 and S2 are formed, deterioration caused by a thermal shock of bonded portions with the solders S1 and S2 can be inhibited. The resin electrode layers 20 and 22 have flexibility. Thus, when the multilayer capacitor 1G is mounted on the circuit board 100, stress received from the circuit board 100 or the like can be relaxed by the resin electrode layer 20. Therefore, occurrence of cracks at the element 2 of the multilayer capacitor 1G can be inhibited.

In the multilayer capacitor 1G according to the present embodiment, the resin electrode layers 20 and 22 of the first and second external electrodes 3B and 4B are not disposed on the main surface 2c of the element 2. Thereby, thicknesses of the first and second external electrodes 3B and 4B on the main surfaces 2c can be reduced. For this reason, a distance between the first external electrode 3B and the connection conductor 5 and a distance between the second external electrode 4B and the connection conductor 5 can be secured (lengthened). Thereby, when the multilayer capacitor 1G is mounted, the connection conductor 5 comes into contact with electrodes or the like of a circuit board, and the occurrence of a short circuit between the first external electrode 3B and/or the second external electrode 4B and the connection conductor 5 can be inhibited. Therefore, the first capacity parts C1 and the second capacity parts C2 can be configured to be connected in series.

In the multilayer capacitor 1G according to the present embodiment, the connection conductor 5 is not provided with the resin electrode layer. The connection conductor 5 is not bonded to the circuit board. Therefore, there is no need to have heat resistance and flexibility. Thereby, since an increase in thickness of the connection conductor 5 is inhibited, the distance between the first external electrode 3B and the connection conductor 5 and the distance between the second external electrode 4B and the connection conductor 5 can be secured (lengthened). Thereby, when the multilayer capacitor 1G is mounted, the connection conductor 5 comes into contact with electrodes or the like of a circuit board, and the occurrence of a short circuit between the first external electrode 3B and/or the second external electrode 4B and the connection conductor 5 can be inhibited.

Figure 19:
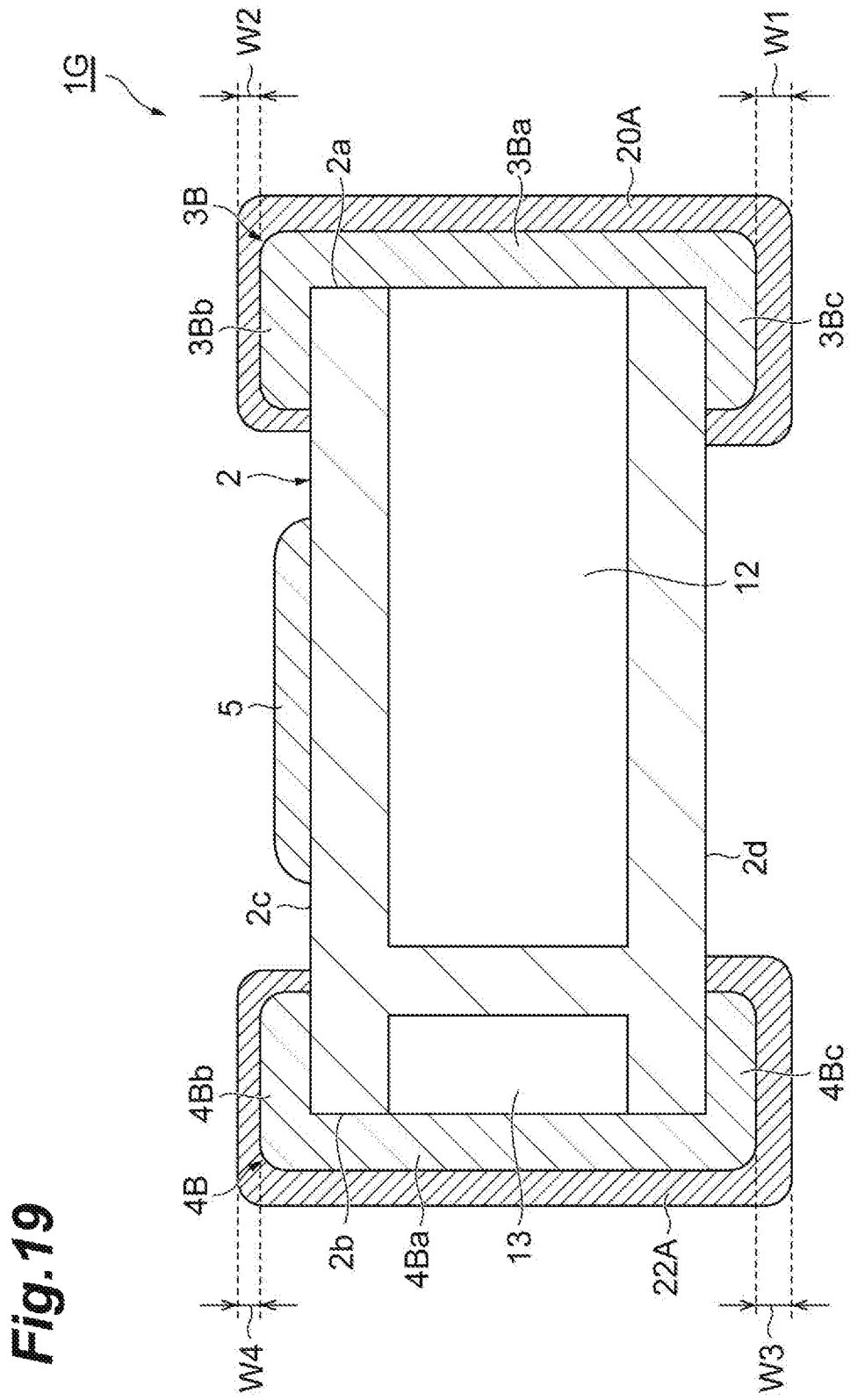
FIG. 19 is a view illustrating an exemplary resin layer thickness.

In the above embodiment, the configuration in which the resin electrode layers 20 and 22 are partly disposed on the first and second external electrodes 3B and 4B has been described by way of example. However, the resin electrode layers 20A and 22A may be disposed throughout the first external electrode 3B and the second external electrode 4B as illustrated in FIG. 19. In this case, it is preferable that a thickness W2 and W4 of the resin electrode layer 20A and 22A close to the main surface 2c that faces the main surface 2d be made smaller than a thickness (a width) W1 and W3 of the resin electrode layer close to the main surface 2d of the element 2 which is the mounting surface. Thereby, thicknesses of the first and second external electrodes 3B and 4B on the main surface 2c of the resin electrode layers 20A and 22A can be reduced. For this reason, the distance between the first external electrode 3B and the connection conductor 5 and the distance between the second external electrode 4B and the connection conductor 5 can be secured (lengthened). Thereby, the occurrence of a short circuit between the first external electrode 3B and/or the second external electrode 4B and the connection conductor 5 can be inhibited. Therefore, the first capacity parts C1 and the second capacity parts C2 can be configured to be connected in series.

Sixth Embodiment

Figure 18A:
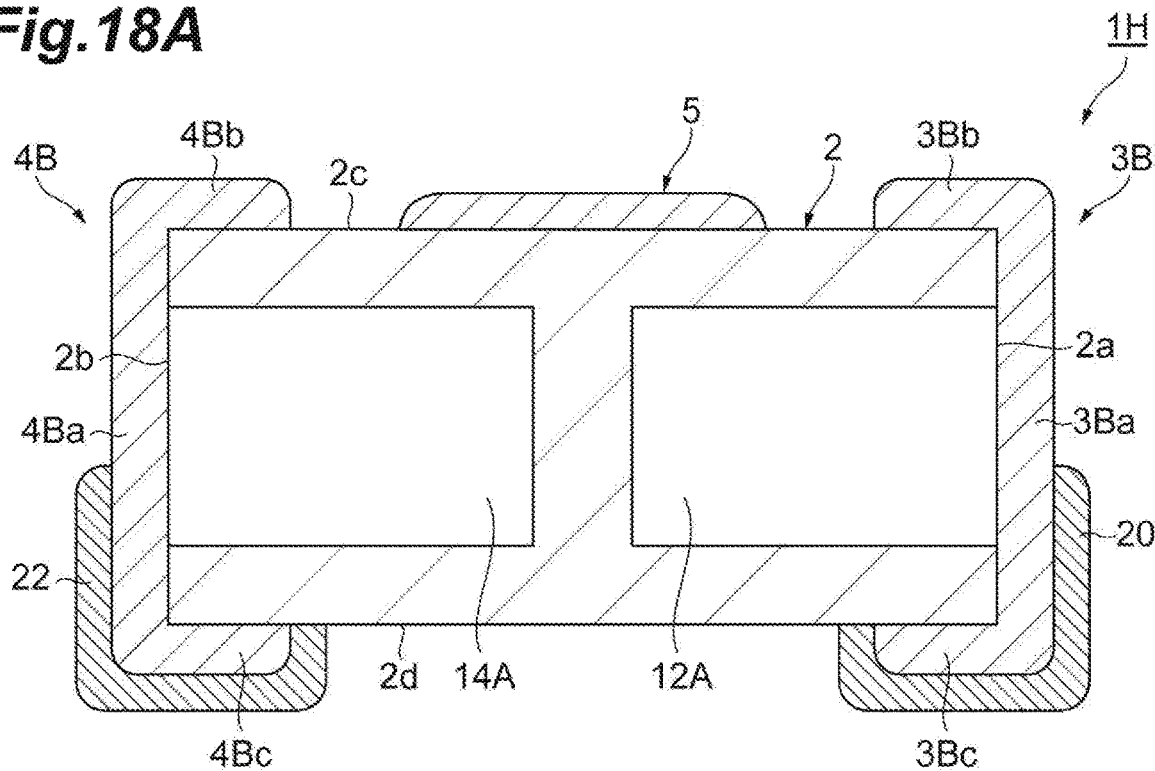
FIG. 18A is a view illustrating a sectional configuration of a multilayer capacitor according to a sixth embodiment.
Figure 18B:
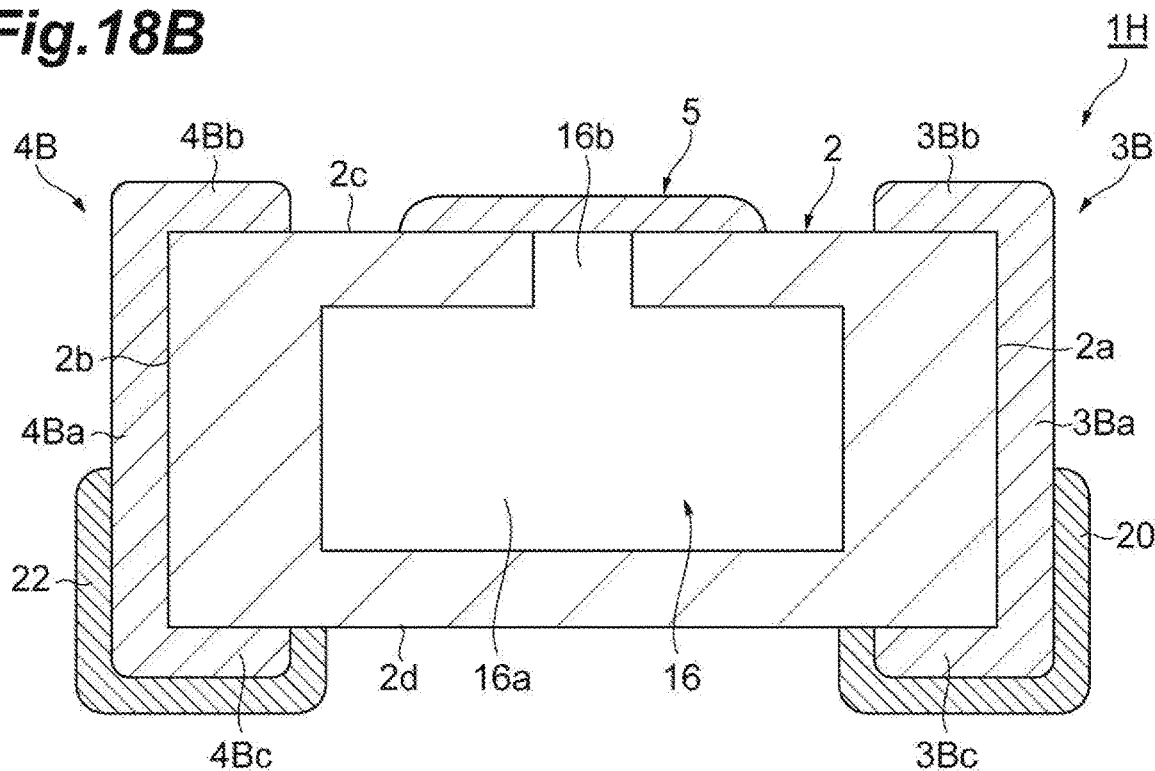
FIG. 18B is a view illustrating a sectional configuration of the multilayer capacitor according to the sixth embodiment.

Next, a multilayer capacitor according to a sixth embodiment will be described. As illustrated in FIGS. 18A and 18B, the multilayer capacitor 1H according to the sixth embodiment includes an element 2, and a first external electrode 3B, a second external electrode 4B, and a connection conductor 5 that are disposed on an outer surface of the element 2. The first external electrode 3B has a resin electrode layer 20. The second external electrode 4B has a resin electrode layer 22.

The multilayer capacitor 1H includes a plurality of first internal electrodes 12A, a plurality of second internal electrodes 14A, and a plurality of third internal electrodes 16 that act as internal conductors disposed in the element 2.

Like the multilayer capacitor 1D of the second embodiment, the multilayer capacitor 1H includes first capacity parts C11 and second capacity parts C22 (see FIG. 13). In the multilayer capacitor 1H, the plurality of first capacity parts C11 are electrically connected in parallel, and the plurality of second capacity parts C22 are electrically connected in parallel. In the multilayer capacitor 1H, the first capacity parts C11 and the second capacity parts C22 are electrically connected in series. To be specific, the first capacity parts C11 and the second capacity parts C22 are electrically connected in series by the plurality of third internal electrodes 16 that are electrically connected by the connection conductor 5.

As described above, in the multilayer capacitor 1H according to the present embodiment, like the multilayer capacitor 1D according to the second embodiment, the occurrence of a failure occurs can be detected while a withstand voltage characteristic is improved.

While embodiments of the present invention have been described, the present invention is not necessarily limited to the aforementioned embodiments, and may be modified in various ways without departing from the spirit or teaching thereof.

In the above embodiments, the configuration in which the connection conductor 5 is disposed on the main surface 2c of the element 2 has been described by way of example. However, the connection conductor need only be disposed on the surfaces (the main surface 2c and the lateral surfaces 2e and 2f) other than the main surface 2d of the element 2 which is the mounting surface.

In the above embodiments, the configuration in which the first internal electrodes 12 (12A, 12B, 12C), the second internal electrodes 14 (14A, 14B, 14C) and the third internal electrodes 16 are orthogonal to the main surface 2d of the element 2 which is the mounting surface and extend in the facing direction of the pair of end faces 2a and 2b has been described by way of example. However, the first internal electrodes, the second internal electrodes, and the third internal electrodes may be orthogonal to the lateral surfaces 2e and 2f of the element 2, and extend in the facing direction of the pair of end faces 2a and 2b.

In the above embodiments, the configuration in which the first external electrode 3 (3A, 3B) has the electrode portions 3a to 3e has been described by way of example. However, the first external electrode 3 (3A, 3B) need only have at least the electrode portions 3a and 3c. Similarly, the second external electrode 4 (4A, 4B) need only have at least the electrode portions 4a and 4c.

What is claimed is:

1. A multilayer capacitor comprising:
    an element configured to have a pair of end faces that face each other and four lateral surfaces that couple the pair of end faces;
    first and second external electrodes disposed close to a respective one of the pair of end faces; and
    a plurality of internal electrodes disposed in the element,
    wherein the plurality of internal electrodes include first internal electrodes that are electrically connected to the first external electrode, second internal electrodes that are electrically connected to the second external electrode, and a plurality of third internal electrodes,
    the plurality of third internal electrodes are electrically connected by a connection conductor,
    first capacity parts are constituted of the first internal electrodes and the third internal electrodes,
    second capacity parts are constituted of the second internal electrodes and the third internal electrodes,
    the first capacity parts and the second capacity parts are electrically connected in series,
    the connection conductor is disposed in a center portion between the pair of end faces in the facing direction on at least one of the three lateral surfaces other than the lateral surface that is a mounting surface, among the four lateral surfaces,
    the third internal electrodes each have a connector part exposed to the lateral surface on which the connection conductor is disposed, and each connector part is directly connected to the connection conductor located in the center portion.

2. The multilayer capacitor according to claim 1, wherein:
    the first internal electrodes, the second internal electrodes, and the third internal electrodes each extend in a facing direction of the pair of end faces and in a direction orthogonal to the mounting surface; and
    the connection conductor is disposed on a lateral surface that is not the mounting surface and that faces the mounting surface.

3. The multilayer capacitor according to claim 1, wherein each of the first external electrode and the second external electrode has a resin electrode layer.

4. The multilayer capacitor according to claim 3, wherein a thickness of each resin electrode layer close to a lateral surface that faces the mounting surface is smaller than a thickness of the resin electrode layer close to the mounting surface.

5. The multilayer capacitor according to claim 3, wherein each resin electrode layer is partly disposed on a respective one of the first external electrode and the second external electrode.

6. The multilayer capacitor according to claim 5, wherein each resin electrode layer is not disposed on a lateral surface that faces the mounting surface.

* * * * *